(12) United States Patent
Silverbrook

(10) Patent No.: US 6,214,244 B1
(45) Date of Patent: Apr. 10, 2001

(54) METHOD OF MANUFACTURE OF A REVERSE SPRING LEVER INK JET PRINTER

(75) Inventor: Kia Silverbrook, Sydney (AU)

(73) Assignee: Silverbrook Research PTY Ltd., Balmain (AU)

( * ) Notice: Subject to any disclaimer, the term of this patent is extended or adjusted under 35 U.S.C. 154(b) by 0 days.

(21) Appl. No.: 09/112,828

(22) Filed: Jul. 10, 1998

(30) Foreign Application Priority Data

Jul. 15, 1997 (AU) .................................................... P07991
Jul. 15, 1997 (AU) .................................................... P08054

(51) Int. Cl.⁷ ........................................................ B41J 2/16
(52) U.S. Cl. ............................................... 216/27; 438/21
(58) Field of Search .......................... 216/2, 27; 438/21; 347/53, 54, 59; 29/890.09; 251/129.06, 129.15

(56) References Cited

U.S. PATENT DOCUMENTS

| | | | |
|---|---|---|---|
| 4,032,929 | * 6/1977 | Fischbeck et al. | 346/140 R |
| 4,628,576 | * 12/1986 | Giachino et al. | 29/157.1 R |
| 4,633,267 | * 12/1986 | Meinhof | 346/1.1 |
| 4,826,131 | * 5/1989 | Mikkor | 251/129.17 |
| 5,029,805 | * 7/1991 | Albarda et al. | 251/11 |
| 5,040,002 | * 8/1991 | Pollacek et al. | 346/140 R |
| 5,225,854 | * 7/1993 | Stänkelström et al. | 346/140 R |
| 5,565,113 | * 10/1996 | Hadimioglu et al. | 216/2 |
| 5,588,466 | * 12/1996 | Benz et al. | 137/831 |
| 5,784,083 | * 7/1998 | Schumann et al. | 347/54 |
| 5,863,024 | * 1/1999 | Blind et al. | 251/129.01 |
| 5,971,355 | * 10/1999 | Biegelsen et al. | 251/129.06 |

FOREIGN PATENT DOCUMENTS

2937742 A1 * 3/1981 (DE).
3-240547 * 10/1991 (JP).

OTHER PUBLICATIONS

Krause, P. et al, "A Micromachined single–chip printhead" Sensors and Actuators A 53, pp 405–409, 1996.*

* cited by examiner

Primary Examiner—Anita Alanko

(57) ABSTRACT

A method of manufacturing an ink jet printhead, the method including providing a semiconductor wafer having an electrical circuitry layer and a buried epitaxial layer formed thereon. A plurality of ink chamber cavities are etched in the wafer. Fixed magnetic plates are formed on the electrical circuitry layer. Conductive coils are formed on an insulating layer and are conductively interconnected to respective fixed magnetic plates. Moveable magnetic plates, respective lever arms extending from the moveable magnetic plates, respective pistons on ends of the lever arms and respective fulcrums and torsional springs intermediate the moveable magnetic plates and the pistons are formed in a sacrificial layer that is deposited and then etched. Ink ejection nozzles are etched through the epitaxial layer to communicate with respective nozzle chamber cavities.

8 Claims, 8 Drawing Sheets

METHOD OF MANUFACTURE OF A REVERSE SPRING LEVER INK JET PRINTER

CROSS REFERENCES TO RELATED APPLICATIONS

The following Australian provisional patent applications are hereby incorporated by cross-reference. For the purposes of location and identification, U.S. patent applications identified by their U.S. patent application serial numbers (USSN) are listed alongside the Australian applications from which the U.S. patent applications claim the right of priority.

| CROSS-REFERENCED AUSTRALIAN PROVISIONAL PATENT NO. | U.S. patent application (CLAIMING RIGHT OF PRIORITY FROM AUSTRALIAN PROVISIONAL APPLICATION) | DOCKET NO. |
|---|---|---|
| PO7991 | 09/113,060 | ART01 |
| PO8505 | 09/113,070 | ART02 |
| PO7988 | 09/113,073 | ART03 |
| PO9395 | 09/112,748 | ART04 |
| PO8017 | 09/112,747 | ART06 |
| PO8014 | 09/112,776 | ART07 |
| PO8025 | 09/112,750 | ART08 |
| PO8032 | 09/112,746 | ART09 |
| PO7999 | 09/112,743 | ART10 |
| PO7998 | 09/112,742 | ART11 |
| PO8031 | 09/112,741 | ART12 |
| PO8030 | 09/112,740 | ART13 |
| PO7997 | 09/112,739 | ART15 |
| PO7979 | 09/113,053 | ART16 |
| PO8015 | 09/112,738 | ART17 |
| PO7978 | 09/113,067 | ART18 |
| PO7982 | 09/113,063 | ART19 |
| PO7989 | 09/113,069 | ART20 |
| PO8019 | 09/112,744 | ART21 |
| PO7980 | 09/113,058 | ART22 |
| PO8018 | 09/112,777 | ART24 |
| PO7938 | 09/113,224 | ART25 |
| PO8016 | 09/112,804 | ART26 |
| PO8024 | 09/112,805 | ART27 |
| PO7940 | 09/113,072 | ART28 |
| PO7939 | 09/112,785 | ART29 |
| PO8501 | 09/112,797 | ART30 |
| PO8500 | 09/112,796 | ART31 |
| PO7987 | 09/113,071 | ART32 |
| PO8022 | 09/112,824 | ART33 |
| PO8497 | 09/113,090 | ART34 |
| PO8020 | 09/112,823 | ART38 |
| PO8023 | 09/113,222 | ART39 |
| PO8504 | 09/112,786 | ART42 |
| PO8000 | 09/113,051 | ART43 |
| PO7977 | 09/112,782 | ART44 |
| PO7934 | 09/113,056 | ART45 |
| PO7990 | 09/113,059 | ART46 |
| PO8499 | 09/113,091 | ART47 |
| PO8502 | 09/112,753 | ART48 |
| PO7981 | 09/113,055 | ART50 |
| PO7986 | 09/113,057 | ART51 |
| PO7983 | 09/113,054 | ART52 |
| PO8026 | 09/112,752 | ART53 |
| PO8027 | 09/112,759 | ART54 |
| PO8028 | 09/112,757 | ART56 |
| PO9394 | 09/112,758 | ART57 |
| PO9396 | 09/113,107 | ART58 |
| PO9397 | 09/112,829 | ART59 |
| PO9398 | 09/112,792 | ART60 |
| PO9399 | 09/112,791, U.S. Pat. No. 6,106,147 | ART61 |
| PO9400 | 09/112,790 | ART62 |
| PO9401 | 09/112,789 | ART63 |
| PO9402 | 09/112,788 | ART64 |
| PO9403 | 09/112,795 | ART65 |
| PO9405 | 09/112,749 | ART66 |
| PP0959 | 09/112,784 | ART68 |
| PP1397 | 09/112,783 | ART69 |
| PP2370 | 09/112,781 | DOT01 |
| PP2371 | 09/113,052 | DOT02 |
| PO8003 | 09/112,834 | Fluid01 |
| PO8005 | 09/113,103 | Fluid02 |
| PO9404 | 09/113,101 | Fluid03 |
| PO8066 | 09/112,751 | IJ01 |
| PO8072 | 09/112,787 | IJ02 |
| PO8040 | 09/112,802 | IJ03 |
| PO8071 | 09/112,803 | IJ04 |
| PO8047 | 09/113,097 | IJ05 |
| PO8035 | 09/113,099 | IJ06 |
| PO8044 | 09/113,084 | IJ07 |
| PO8063 | 09/113,066 | IJ08 |
| PO8057 | 09/112,778 | IJ09 |
| PO8056 | 09/112,779 | IJ10 |
| PO8069 | 09/113,077 | IJ11 |
| PO8049 | 09/113,061 | IJ12 |
| PO8036 | 09/112,818 | IJ13 |
| PO8048 | 09/112,816 | IJ14 |
| PO8070 | 09/112,772 | IJ15 |
| PO8067 | 09/112,819 | IJ16 |
| PO8001 | 09/112,815 | IJ17 |
| PO8038 | 09/113,096 | IJ18 |
| PO8033 | 09/113,068 | IJ19 |
| PO8002 | 09/113,095 | IJ20 |
| PO8068 | 09/112,808 | IJ21 |
| PO8062 | 09/112,809 | IJ22 |
| PO8034 | 09/112,780 | IJ23 |
| PO8039 | 09/113,083 | IJ24 |
| PO8041 | 09/113,121 | IJ25 |
| PO8004 | 09/113,122 | IJ26 |
| PO8037 | 09/112,793 | IJ27 |
| PO8043 | 09/112,794 | IJ28 |
| PO8042 | 09/113,128 | IJ29 |
| PO8064 | 09/113,127 | IJ30 |
| PO9389 | 09/112,756 | IJ31 |
| PO9391 | 09/112,755 | IJ32 |
| PP0888 | 09/112,754 | IJ33 |
| PP0891 | 09/112,811 | IJ34 |
| PP0890 | 09/112,812 | IJ35 |
| PP0873 | 09/112,813 | IJ36 |
| PP0993 | 09/112,814 | IJ37 |
| PP0890 | 09/112,764 | IJ38 |
| PP1398 | 09/112,765 | IJ39 |
| PP2592 | 09/112,767 | IJ40 |
| PP2593 | 09/112,768 | IJ41 |
| PP3991 | 09/112,807 | IJ42 |
| PP3987 | 09/112,806 | IJ43 |
| PP3985 | 09/112,820 | IJ44 |
| PP3983 | 09/112,821 | IJ45 |
| PO7935 | 09/112,822 | IJM01 |
| PO7936 | 09/112,825 | IJM02 |
| PO7937 | 09/112,826 | IJM03 |
| PO8061 | 09/112,827 | IJM04 |
| PO8054 | 09/112,828 | IJM05 |
| PO8065 | 09/113,111, U.S. Pat. No. 6,071,750 | IJM06 |
| PO8055 | 09/113,108 | IJM07 |
| PO8053 | 09/113,109 | IJM08 |
| PO8078 | 09/113,123 | IJM09 |
| PO7933 | 09/113,114 | IJM10 |
| PO7950 | 09/113,115 | IJM11 |
| PO7949 | 09/113,129 | IJM12 |
| PO8060 | 09/113,124 | IJM13 |
| PO8059 | 09/113,125 | IJM14 |
| PO8073 | 09/113,126 | IJM15 |
| PO8076 | 09/113,119 | IJM16 |
| PO8075 | 09/113,120 | IJM17 |
| PO8079 | 09/113,221 | IJM18 |
| PO8050 | 09/113,116 | IJM19 |
| PO8052 | 09/113,118 | IJM20 |
| PO7948 | 09/113,117 | IJM21 |
| PO7951 | 09/113,113 | IJM22 |

-continued

| CROSS-REFERENCED AUSTRALIAN PROVISIONAL PATENT NO. | U.S. patent application (CLAIMING RIGHT OF PRIORITY FROM AUSTRALIAN PROVISIONAL APPLICATION) | DOCKET NO. |
|---|---|---|
| PO8074 | 09/113,130 | IJM23 |
| PO7941 | 09/113,110 | IJM24 |
| PO8077 | 09/113,112 | IJM25 |
| PO8058 | 09/113,087 | IJM26 |
| PO8051 | 09/113,074 | IJM27 |
| PO8045 | 09/113,089, U.S. Pat. No. 6,111,754 | IJM28 |
| PO7952 | 09/113,088 | IJM29 |
| PO8046 | 09/112,771 | IJM30 |
| PO9390 | 09/112,769 | IJM31 |
| PO9392 | 09/112,770 | IJM32 |
| PP0889 | 09/112,798 | IJM35 |
| PP0887 | 09/112,801 | IJM36 |
| PP0882 | 09/112,800 | IJM37 |
| PP0874 | 09/112,799 | IJM38 |
| PP1396 | 09/113,098 | IJM39 |
| PP3989 | 09/112,833 | IJM40 |
| PP2591 | 09/112,832 | IJM41 |
| PP3990 | 09/112,831 | IJM42 |
| PP3986 | 09/112,830 | IJM43 |
| PP3984 | 09/112,836 | IJM44 |
| PP3982 | 09/112,835 | IJM45 |
| PP0895 | 09/113,102 | IR01 |
| PP0870 | 09/113,106 | IR02 |
| PP0869 | 09/113,105 | IR04 |
| PP0887 | 09/113,104 | IR05 |
| PP0885 | 09/112,810 | IR06 |
| PP0884 | 09/112,766 | IR10 |
| PP0886 | 09/113,085 | IR12 |
| PP0871 | 09/113,086 | IR13 |
| PP0876 | 09/113,094 | IR14 |
| PP0877 | 09/112,760 | IR16 |
| PP0878 | 09/112,773 | IR17 |
| PP0879 | 09/112,774 | IR18 |
| PP0883 | 09/112,775 | IR19 |
| PP0880 | 09/112,745 | IR20 |
| PP0881 | 09/113,092 | IR21 |
| PO8006 | 09/113,100, U.S. Pat. No. 6,087,638 | MEMS02 |
| PO8007 | 09/113,093 | MEMS03 |
| PO8008 | 09/113,062 | MEMS04 |
| PO8010 | 09/113,064, U.S. Pat. No. 6,041,600 | MEMS05 |
| PO8011 | 09/113,082 | MEMS06 |
| PO7947 | 09/113,081, U.S. Pat. No. 6,067,797 | MEMS07 |
| PO7944 | 09/113,080 | MEMS09 |
| PO7946 | 09/113,079, U.S. Pat. No. 6,044,646 | MEMS10 |
| PO9393 | 09/113,065 | MEMS11 |
| PP0875 | 09/113,078 | MEMS12 |
| PP0894 | 09/113,075 | MEMS13 |

STATEMENT REGARDING FEDERALLY SPONSORED RESEARCH OR DEVELOPMENT

Not applicable.

FIELD OF THE INVENTION

The present invention relates to the manufacture of ink jet printheads and, in particular, discloses a method of manufacturing an ink jet printhead.

BACKGROUND OF THE INVENTION

Many ink jet printing mechanisms are known. Unfortunately, in mass production techniques, the production of ink jet printheads is quite difficult. For example, the orifice or nozzle plate is often constructed separately from the ink supply and ink ejection mechanism and bonded to the mechanism at a later stage (Hewlett-Packard Journal, Vol. 36 no 5, pp33–37 (1985)). These separate material processing steps required in handling such precision devices often add a substantial expense in manufacturing.

Additionally, side shooting ink jet technologies (U.S. Pat. No. 4,899,181) are often used but again, the amount of mass production throughput is limited given any particular capital investment.

Additionally, more esoteric techniques are also often utilised. These can include electroforming of nickel stage (Hewlett-Packard Journal, Vol. 36 no 5, pp33–37 (1985)), electro-discharge machining, laser ablation (U.S. Pat. No. 5,208,604), micro-punching, etc.

The utilisation of the above techniques is likely to add substantial expense to the mass production of ink jet print heads and therefore add substantially to their final cost.

It would therefore be desirable if an efficient system for the mass production of ink jet print heads could be developed.

SUMMARY OF THE INVENTION

In accordance with the present invention, there is provided a method of manufacturing an ink jet printhead wherein an array of nozzles are formed on a substrate utilising planar monolithic deposition, lithographic and etching processes. Preferably, multiple ink jet nozzles are formed simultaneously on a single planar substrate such as a silicon wafer.

The printhead can be formed utilising standard vlsi/ulsi processing and can include integrated drive electronics formed on the same substrate. The drive electronics is preferably of a CMOS type. In printhead is manufactured so that ink can be ejected from the substrate generally normal to the substrate.

In accordance with a further aspect of the present invention, there is provided a method of manufacturing of an ink jet printhead that includes a series of nozzle chambers, the method comprising the steps of: (a) providing a semiconductor wafer having an electrical circuitry layer and a buried epitaxial layer formed thereon on; (b) etching nozzle chamber cavities in the wafer the etching stopping substantially at the epitaxial layer; (c) depositing and etching a first layer having a high saturation flux density on the electrical circuitry layer to define fixed magnetic plates; (d) depositing and etching an insulating layer on the first layer and the electrical circuitry layer, the etching including etching vias for a subsequent conductive layer; (e) depositing and etching a conductive layer on the insulating layer to form conductive coils conductively interconnected to the first layer; (f) depositing and etching a sacrificial material layer in the region of the fixed magnetic plates and the coils, the etching including defining apertures for a series of torsional springs, lever arms and interconnected pistons; (g) depositing and etching a second layer having a high saturation flux density to form an interconnected moveable magnetic plate, lever arms attached to pistons and a series of torsional springs around which the lever arms pivot; (h) etching the back of the wafer to the epitaxial layer; (i) etching ink ejection nozzles through the epitaxial layer to communicate with the nozzle chamber cavities; and (j) etching away any remaining sacrificial layers.

The step (f) may include etching cavities for a series of torsional springs. The step (g) preferably includes forming a series of torsional pivot springs interconnected with the lever arm for resiliently biasing the moveable magnetic plate in a spaced position relative to the first magnetic plate.

The conductive layer may comprise substantially copper and the magnetic flux material may comprise substantially a cobalt nickel iron alloy.

The etching of layers preferably includes etching vias to allow for the electrical interconnection of portions of layers.

The wafer may be separated into printheads chips.

BRIEF DESCRIPTION OF THE DRAWINGS

Notwithstanding any other forms which may fall within the scope of the present invention, preferred forms of the invention are now described, by way of example only, with reference to the accompanying drawings, in which.

DESCRIPTION OF PREFERRED AND OTHER EMBODIMENTS

The preferred embodiment of the present invention relies upon the utilisation of a magnetic actuator to "load" a spring, such that, upon deactivation of the magnetic actuator the resultant movement of the spring causes ejection of a drop of ink as the spring returns to its original position.

Figure 1:
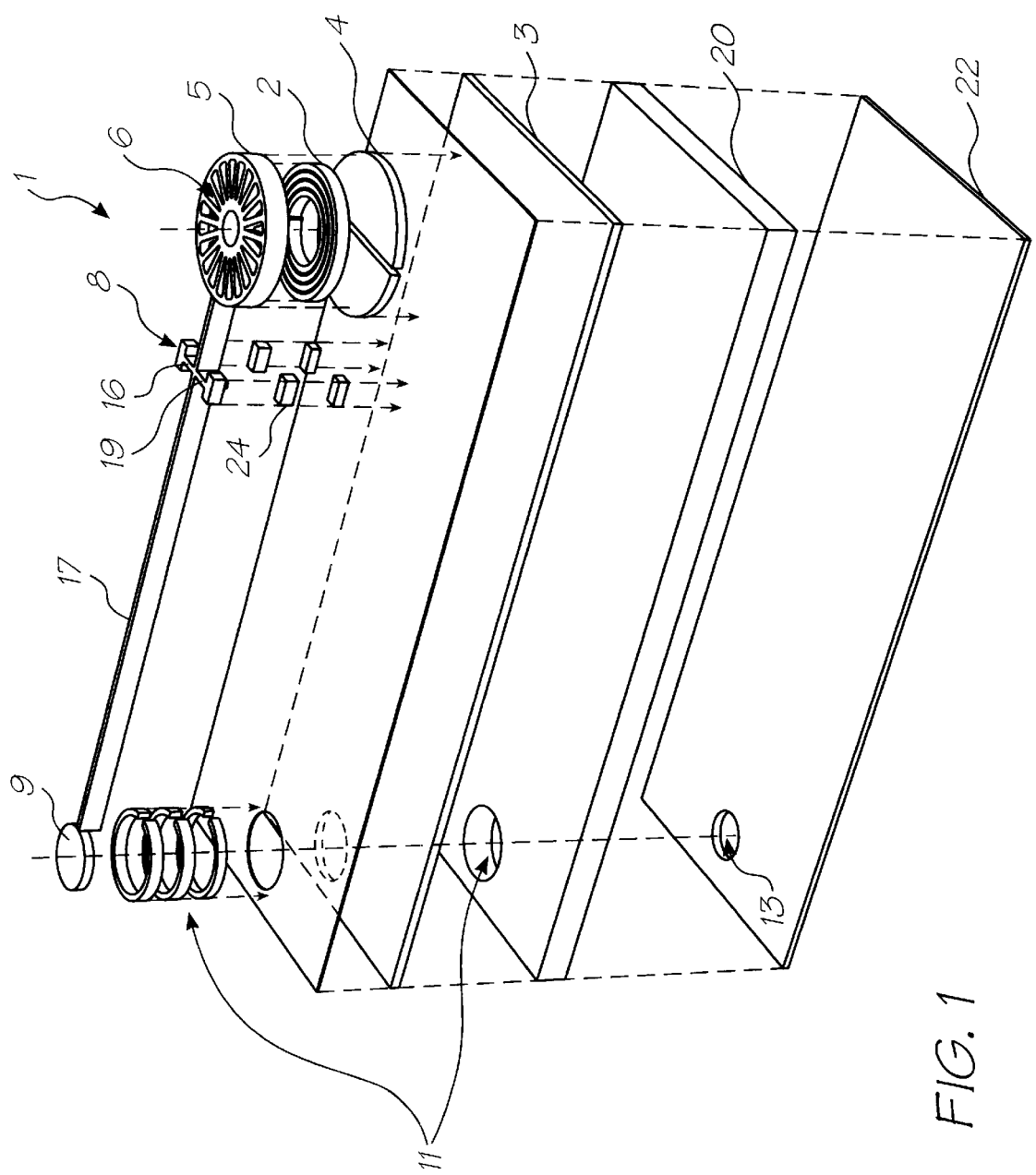
FIG. 1 is an exploded perspective view of a single ink jet nozzle in accordance with the preferred embodiment.

In FIG. 1, there is illustrated an exploded perspective view of one ink nozzle arrangement 1 of a printhead manufactured in accordance with the preferred embodiment of this invention. The printhead is manufactured to incorporate an array of the nozzle arrangements 1, the array being suitable for printing.

Operation of the ink nozzle arrangement 1 includes energising a solenoid 2 with a driving circuit 3. The energised solenoid 2 induces a magnetic field in a fixed soft magnetic plate 4 and a moveable soft magnetic plate 5. The solenoid is sufficiently energised to move the plate 5 from a rest position to a pre-release position adjacent the fixed magnetic plate 4. The ink nozzle arrangement 1 of FIG. 1 sits within an ink chamber filled with ink. Therefore, holes 6 are defined in the moveable soft magnetic plate 5 to facilitate movement of the plate 5 through the ink when the plate 5 moves.

A lever arm 17 that extends from the moveable soft magnetic plate 5 has a piston 9 on an end thereof. A fulcrum 8 is arranged on the lever arm 17, intermediate the plate 5 and the end of the arm 17. Movement of the magnetic plate 5 closer to the plate 4 causes the piston 9 to move away from a nozzle chamber 11 drawing air into the chamber 11 via an ink ejection port 13. The piston 9 is then held open above the nozzle chamber 11 by maintaining a low "keeper" current through the solenoid 2. The keeper current through the solenoid 2 is sufficient to retain the moveable plate 5 adjacent the fixed plate 4. The level of current is substantially less than the maximum current level because the gap between the two plates 4 and 5 is at a minimum. For example, a keeper current of 10% of the maximum current level is suitable. During this phase of operation, a meniscus of ink at the ink ejection port 13 is a concave hemisphere due to the inflow of air. The surface tension on the meniscus exerts a net force on the ink which results in ink flow from the ink chamber into the nozzle chamber 11. This results in the nozzle chamber 11 refilling, replacing the volume taken up by the piston 9 which has been withdrawn. This process takes approximately 100 µs.

The current within solenoid 2 is then reversed to half that of the maximum current. The reversal demagnetises the magnetic plates 4, 5 and initiates a return of the piston 9 to its rest position. The piston 9 is moved to its normal rest position by both a magnetic repulsion between the plates 7, 5 and by energy stored in a stressed tortional spring 16,19, arranged on the arm 17 at the fulcrum 8, which is torsionally stressed upon movement of the plate 5.

The forces applied to the piston 9 as a result of the reverse current and spring 16,19 is greatest at the beginning of the movement of the piston 9 and decreases as the spring elastic stress falls to zero. As a result, the acceleration of the piston 9 is high at the beginning of a return stroke and a resultant ink velocity within the nozzle chamber 11 becomes uniform during the return stroke. This results in an increased operating tolerance before ink flow over the printhead surface occurs.

At a predetermined moment during the return stroke, the solenoid current is at off. The current is at off when a residual magnetism of the movable plate 5 is at a minimum. The piston 9 then continues to move towards its original rest position.

The piston 9 overshoots the quiescent or rest position due to its inertia. Overshoot in the piston movement achieves two things: greater ejected drop volume and velocity, and improved drop break off as the piston returns from overshoot to its quiescent position.

The piston 9 eventually returns from overshoot to the quiescent position. This return is caused by the springs 16, 19 which are stressed in the opposite direction as a result of the overshoot. The piston return draws some of the ink back into the nozzle chamber 11, causing an ink ligament connecting the ink drop to the ink in the nozzle chamber 11 to thin. The forward velocity of the drop and the backward velocity of the ink in the nozzle chamber 11 result in the ink drop breaking off from the ink in the nozzle chamber 11.

The piston 9 stays in the quiescent position until the next drop ejection cycle.

A liquid ink printhead has one ink nozzle arrangement 1 associated with each of a plurality of nozzles. The arrangement 1 has the following major parts:

(1) Drive circuitry 3 for driving the solenoid 2.

(2) An ink ejection port 13. The radius of the port 13 is an important determinant of drop velocity and drop size.

(3) A piston 9. This is a cylinder which moves through the nozzle chamber 11 to expel the ink. The piston 9 is connected to one end of the lever arm 17. The piston radius is approximately 1.5 to 2 times the radius of the hole 13. The ink drop volume output is mostly determined by the volume of ink displaced by the piston 9 during the piston return stroke.

(4) A nozzle chamber 11. The nozzle chamber 11 is slightly wider than the piston 9. The gap between the piston 9 and wall of the nozzle chamber 11 is as small as is required to ensure that the piston does not contact the nozzle chamber 11 during actuation or return. If the print heads are fabricated using 0.5 $\mu$m semiconductor lithography, then a 1 $\mu$m gap will usually be sufficient. The nozzle chamber is also deep enough so that air drawn in through the port 13 when the plunger 9 returns to its quiescent state does not extend to the piston 9. If it does, the nozzle will not refill properly.

(5) A solenoid 2. This is a spiral coil of copper. Copper is used for its low resistivity, and high electro-migration resistance.

(6) A fixed magnetic plate 4 of ferromagnetic material.

(7) A moveable magnetic plate 5 of ferromagnetic material. To maximise the magnetic force generated, the moveable magnetic plate 5 and fixed magnetic plate 4, are positioned relative to the solenoid 2 so that little magnetic flux is lost, and the flux is concentrated across a gap between the moveable magnetic plate 5 and the fixed plate 4. The moveable magnetic plate 5 has holes 6 defined therein (FIG. 1) above the solenoid 2 to allow ink to move through the holes 6 when the plate 5 moves. The holes 6 are arranged and shaped so as to minimise their effect on the magnetic force generated between the moveable magnetic plate 5 and the fixed magnetic plate 4.

Figure 19:
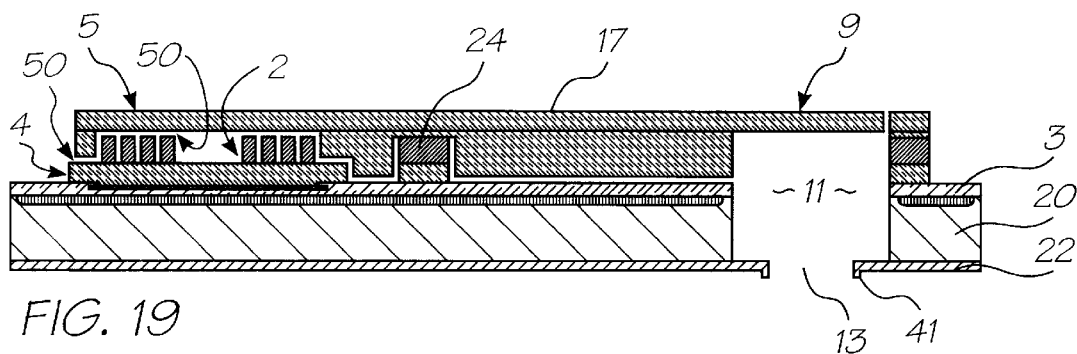
FIG. 19 shows the wafer of FIG. 18 detached from the glass blank.

(8) A magnetic gap 50 (FIG. 19). The gap between the fixed plate 4 and the moveable magnetic plate 5 is an important feature of the nozzle arrangement 1. The size of the gap strongly affects the magnetic force generated, and also limits the travel of the moveable magnetic plate 5. A small gap is desirable to achieve a strong magnetic force. The travel of the piston 9 via the lever arm 17, is dependent on the extent of travel of the moveable magnetic plate 5 and hence the size of the gap and the position of the fulcrum 8.

(9) The lever arm 17. The lever arm 17 allows the travel of the piston 9 and the moveable magnetic plate 5 to be independently optimised by suitable positioning of the fulcrum 8. The moveable plate 5 is at a short end of the lever arm 17. The piston 9 is at a long end of the lever arm 17. The spring 16 is at the fulcrum 8. The optimum travel for the moveable magnetic plate 5 is less than 1 mm, to minimise the magnetic gap. The optimum travel for the piston 9 is approximately 5 $\mu$m for a 1200 dpi printer. The difference in optimum travel is resolved by a lever 17 with a 5:1 or greater ratio in arm length.

(10) Springs 16, 19 (FIG. 1). The springs 16, 19 return the piston 9 to its quiescent position after a deactivation of an actuator. The springs 16, 19 are at the fulcrum 8 of the lever arm.

(11) Passivation layers (not shown). A1 surfaces are preferably coated with passivation layers, which may be silicon nitride ($Si_3N_4$), diamond like carbon (DLC), or other chemically inert, highly impermeable layer. The passivation layers are especially important for device lifetime, as the active device is immersed in the ink. As will be evident from the foregoing description there is an advantage in ejecting the drop on deactivation of the solenoid 2. This advantage comes from the rate of acceleration of the moving magnetic plate 5 which is used as a piston or plunger.

The force produced by a moveable magnetic plate as a result of an electromagnetic induced field is approximately proportional to an inverse square of the gap between the moveable plate 5 and the fixed plate 4. When the solenoid 2 is deactivated, this gap is at a maximum. When the solenoid 2 is activated, the moveable plate 5 is attracted to the fixed plate 4. As the gap decreases, the force increases, accelerating the movable plate 5. The velocity increases in a highly non-linear fashion, approximately with the square of time. During reverse movement of the moveable plate 5, upon deactivation, the acceleration of the moving pole 5 is greatest at the beginning and then slows as the spring elastic stress falls to zero. As a result, the velocity of the plate 5 is more uniform during the reverse stroke movement.

(1) The velocity of the piston 9 is more constant over the duration of the drop ejection stroke.

(2) The piston 9 can readily be entirely removed from the ink chamber during an ink fill stage, and the nozzle filling time can thus be reduced, allowing faster printhead operation.

However, this approach does have some disadvantages over a direct firing type of actuator:

(1) The stresses on the springs 16, 19 are relatively large. Careful design is required to ensure that the springs 16, 19 operate at below the yield strength of the materials used.

(2) The solenoid 2 must be provided with a "keeper" current for the nozzle fill duration. The keeper current is typically less than 10% of the solenoid actuation current. However, the nozzle fill duration is typically around 50 times the drop firing duration, so the keeper energy typically exceeds the solenoid actuation energy.

(3) The operation of an actuator is more complex due to the requirement for a "keeper" phase.

The printhead is fabricated from two silicon wafers. A first wafer is used to fabricate the print nozzles (the printhead nozzle wafer) and a second wafer (the Ink Channel Wafer) is utilised to fabricate the various ink channels in addition to providing a support means for a first channel. The fabrication process proceeds as follows:

(1) Start with a single crystal silicon wafer 20, which has a buried epitaxial layer 22 of silicon which is heavily doped with boron. The boron should be doped to preferably $10^{20}$ atoms per $cm^3$ of boron or more, and be approximately 3 $\mu$m thick, and be doped in a manner suitable for the active semiconductor device technology chosen. The wafer diameter of the printhead wafer should be the same as the ink channel wafer.

(2) Fabricate the drive transistors and data distribution circuitry 3 according to the process chosen (eg. CMOS).

(3) Planarise the wafer 20 using chemical Mechanical Planarisation (CMP).

(4) Deposit 5 mm of glass ($SiO_2$) over the second level metal.

(5) Using a dual damascene process, etch two levels into a top oxide layer. At first level is 4 μm deep, and a second level is 5 μm deep. The second level contacts second level metal. Masks for the fixed magnetic plate are used.

(6) Deposit 5 μm of nickel iron alloy (NiFe).

(7) Planarise the wafer using CMP, until the level of the $SiO_2$ is reached to form the magnetic plates 4.

(8) Deposit 0.1 μm of silicon nitride ($Si_3N_4$).

(9) Etch the $Si_3N_4$ for vias holes for the connections to solenoids, and for the nozzle chambers 11.

(10) Deposit 4 μm of $SiO_2$.

(11) Plasma etch the $SiO_2$ in using a solenoid and support post mask.

(12) Deposit a thin diffusion barrier, such as Ti, TiN, or TiW, and an adhesion layer if the diffusion layer chosen has insufficient adhesion.

(13) Deposit 4 μm of copper to form the solenoid 2 and spring posts 24. The deposition may be by sputtering, CVD, or electroless plating. As well as lower resistivity than aluminium, copper has significantly higher resistance to electro-migration. The electro-migration resistance is significant, as current densities in the order of $3\times10^6$ Amps/$cm^2$ may be required. Copper films deposited by low energy kinetic ion bias sputtering have been found to have 1,000 to 100,000 times larger electro-migration lifetimes than aluminium silicon alloy. The deposited copper should be alloyed and layered for maximum electro-migration electro-migration resistance, while maintaining high electrical conductivity.

(14) Planarise the wafer using CMP, until the level of the $SiO_2$ is reached. A damascene process is used for the copper layer due to the difficulty involved in etching copper. However, since the damascene dielectric layer is subsequently removed, processing is actually simpler if a standard deposit/etch cycle is used instead of damascene. However, it should be noted that the aspect ratio of the copper etch would be 8:1 for this design, compared to only 4:1 for a damascene oxide etch. This difference occurs because the copper is 1 μm wide and 4 μm thick, but has only 0.5 μm spacing. Damascene processing also reduces lithographic difficulty, as the resist is on oxide, not metal.

(15) Plasma etch the nozzle chamber 11, stopping at the boron doped epitaxial silicon layer 22. This etch will be through around 13 μm of $SiO_2$, and 8 μm of silicon. The etch should be highly anisotropic, with near vertical sidewalls. The etch stop detection can be the detection of boron in the exhaust gasses. If this etch is selective against NiFe, the masks for this step and the following step can be combined, and the following step can be eliminated. This step also etches the edge of the print head wafer down to the boron layer, for later separation.

(16) Etch the $SiO_2$ layer. This need only be removed in the regions above the NiFe fixed magnetic poles, so it can be removed in the previous step if an Si and $SiO_2$ etch selective against NiFe is used.

(17) Conformably deposit 0.5 μm of high density $Si_3N_4$. This forms a corrosion barrier, so should be free of pinholes, and be impermeable to OH ions.

(18) Deposit a thick sacrificial layer 40. This layer should entirely fill the nozzle chambers 11, and coat the entire wafer to an added thickness of 8 μm. The sacrificial layer may be $SiO_2$.

(19) Etch two depths in the sacrificial layer for a dual damascene process. The deep etch is 8 μm, and the shallow etch is 3 μm. The masks for this etching define the piston 9, the lever arm 17, the springs 16 and the moveable magnetic pole 5.

(20) Conformably deposit 0.1 μm of high density $Si_3N_4$. This forms a corrosion barrier, so should be free of pinholes, and be impermeable to OH ions.

(21) Deposit 8 μm of nickel iron alloy (NiFe).

(22) Planarise the wafer using CMP, until the level of the $SiO_2$ is reached.

(23) Deposit 0.1 μm of silicon nitride ($Si_3N_4$).

(24) Etch the $Si_3N_4$ everywhere except the top of the pistons.

(25) Open bond pads.

(26) Permanently bond the wafer onto a pre-fabricated ink channel wafer. The active side of the printhead wafer faces the ink channel wafer. The ink channel wafer is attached to a backing plate, as it has already been etched into separate ink channel chips.

(27) Etch the printhead wafer to entirely remove the backside silicon to the level of the boron doped epitaxial layer 22. This etch can be a batch wet etch in ethylenediamine pyrocatechol (EDP).

(28) Mask the nozzle rim 14 from the underside of the printhead wafer. This mask also includes the chip edges.

(31) Etch through the boron doped silicon layer 22, thereby creating the ejection ports 13. This etch should also etch fairly deeply into the sacrificial material in the nozzle chambers 11 to reduce time required to remove the sacrificial layer.

(32) Completely etch the sacrificial material. If this material is $SiO_2$ then a HF etch can be used. The nitride coating on the various layers protects the other glass dielectric layers and other materials in the device from HF etching. Access of the HF to the sacrificial layer material is through the port 13, and simultaneously through the ink channel chip. The effective depth of the etch is 21 μm.

(33) Separate the chips from the backing plate. Each chip is now a full printhead chip including ink channels. The two wafers have already been etched through, so the printheads do not need to be diced.

(34) Test the printheads and TAB bond the good printheads.

(35) Hydrophobise the front surface of the printheads.

(36) Perform final testing on the TAB bonded printheads.

Figure 2:
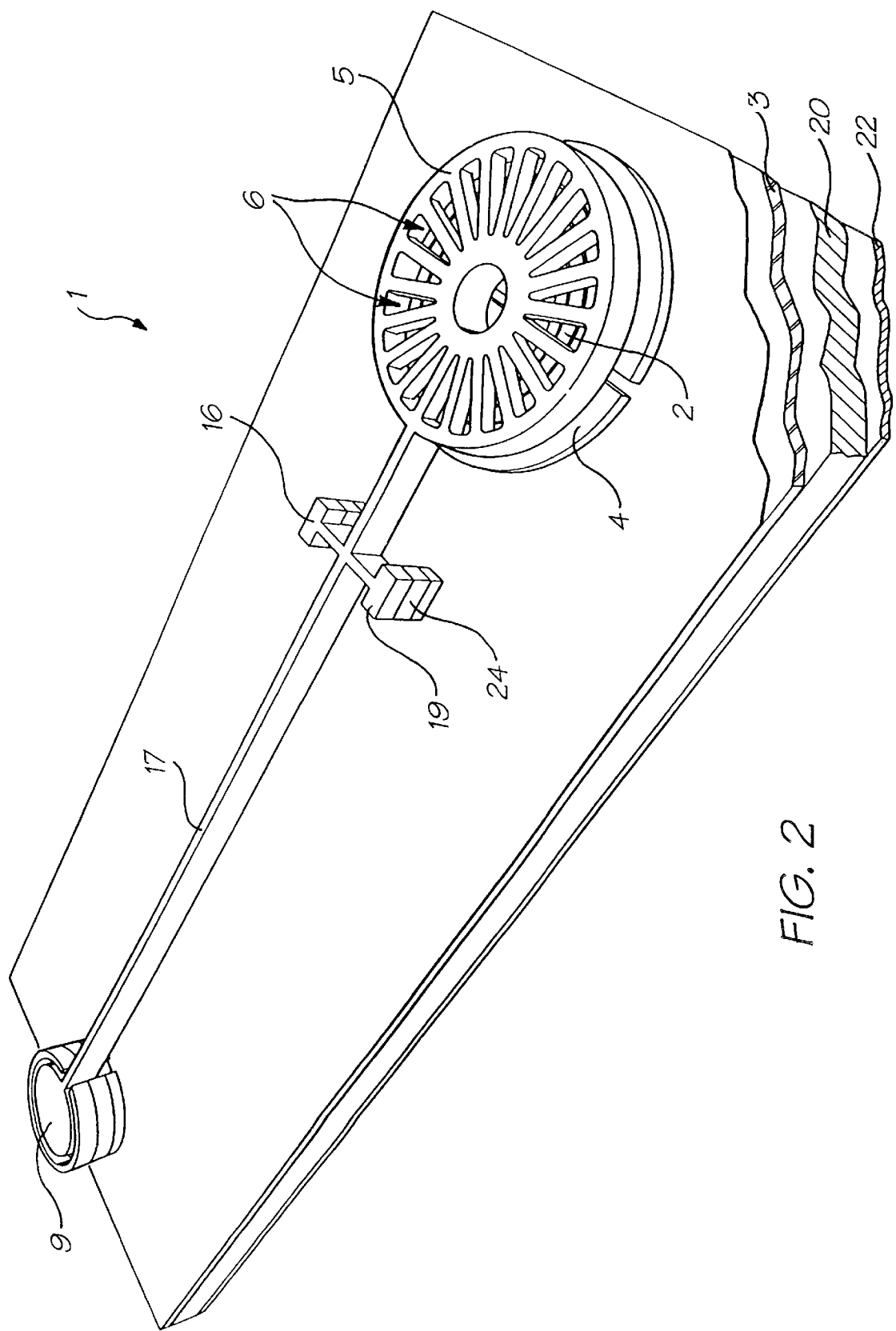
FIG. 2 is a perspective view, party sectioned, of a single ink jet nozzle constructed in accordance with the preferred embodiment.

FIG. 2 shows a perspective view, in part in section, of a single ink jet nozzle arrangement 1 constructed in accordance with the preferred embodiment.

One alternative form of detailed manufacturing process which can be used to fabricate monolithic ink jet printheads operating in accordance with the principles taught by the present embodiment can proceed utilizing the following steps set out below in FIGS. 4 to 20. These figures show steps in the manufacture of a single nozzle arrangement 1.

1. Deposit 3 microns of epitaxial silicon 22 heavily doped with boron on a double sided polised wafer 30.

2. Deposit 10 microns of epitaxial silicon 20, either p-type or n-type, depending upon the CMOS process used.

Figure 3:
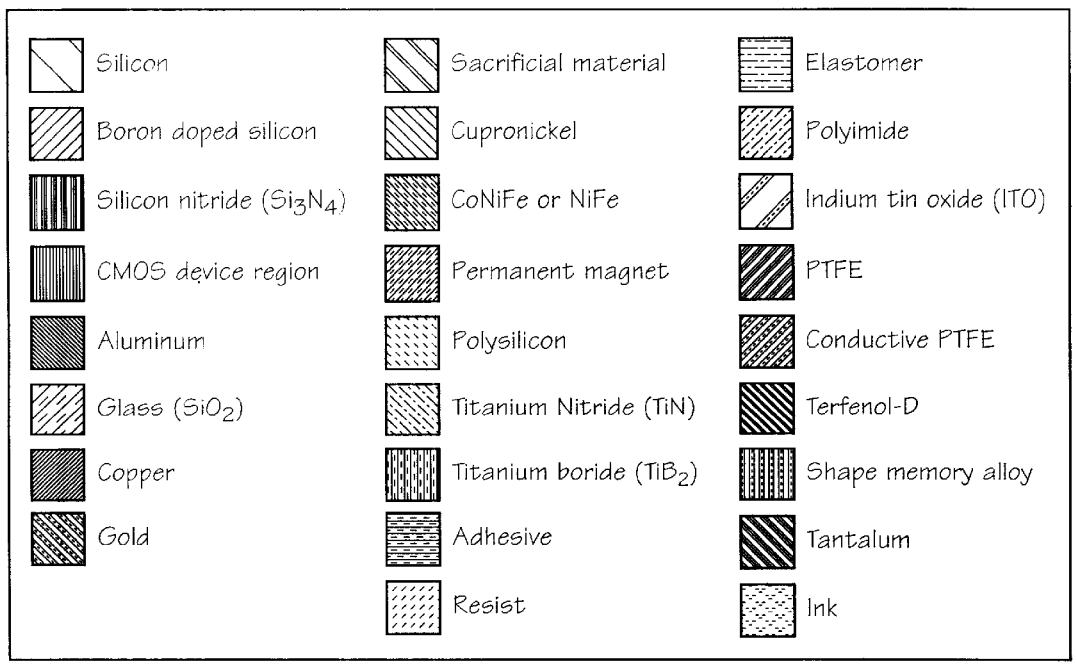
FIG. 3 provides a legend of the materials indicated in FIG. 4 to 20.
Figure 4:
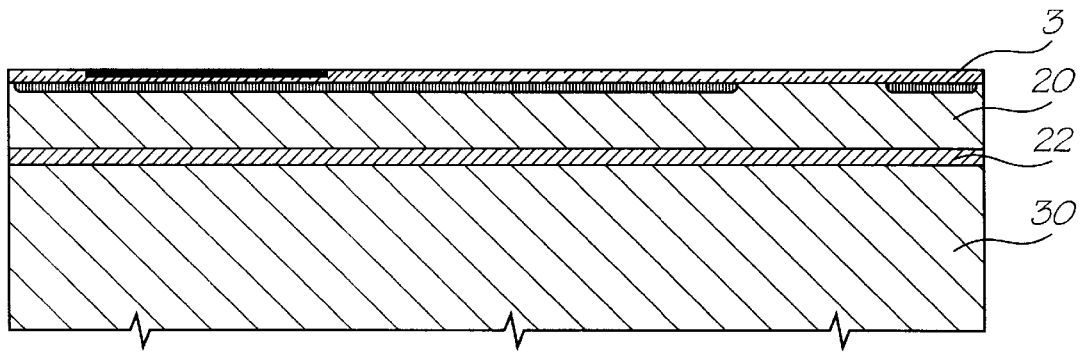
FIG. 4 shows a silicon wafer incorporating an epitaxial layer and an electrical circuitry layer.

3. Complete a 0.5 micron, one poly, 2 metal CMOS process to provide the driving circuit 3. This step is shown in FIG. 4. For clarity, these diagrams may not be to scale, and may not represent a cross section though any single plane of the nozzle arrangement 1. FIG. 3 is a key to representations of various materials in these manufacturing diagrams.

4. Etch the CMOS oxide layers down to silicon or aluminum using Mask 1. This mask defines the nozzle chamber 11, the edges of the printhead chips, and the vias for the contacts from aluminum electrodes to two halves of the fixed magnetic plate 4.

Figure 5:
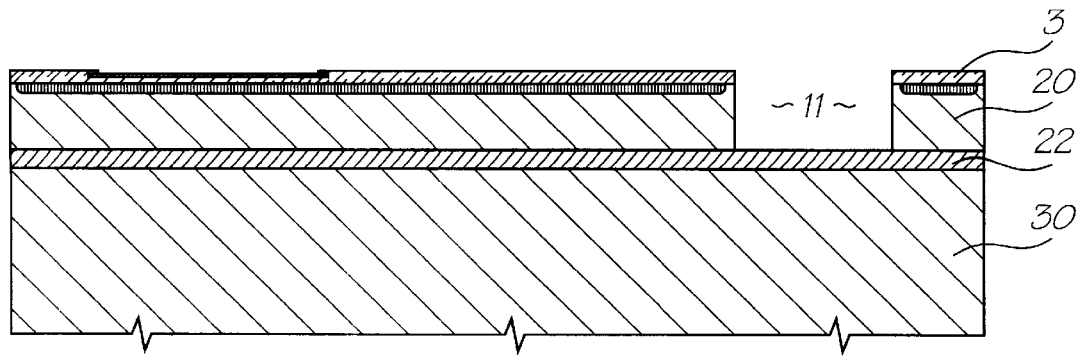
FIG. 5 shows the wafer of FIG. 4 with oxide layers etched to define a nozzle chamber.

5. Plasma etch the silicon down to the epitaxial layer 22, using oxide from step 4 as a mask. This etch does not substantially etch the aluminum. This step is shown in FIG. 5.

6. Deposit a seed layer of cobalt nickel iron alloy. CoNiFe is chosen since it has a high saturation flux density of 2 Tesla, and a low coercivity. [Osaka, Tetsuya et al, A soft magnetic CoNiFe film with high saturation magnetic flux density, Nature 392, 796–798 (1998)].

Figure 6:
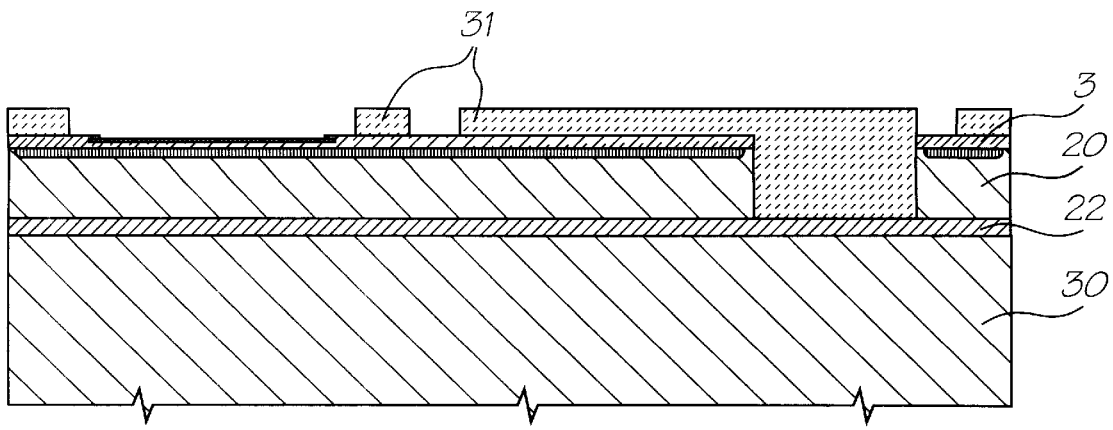
FIG. 6 shows the wafer of FIG. 5 etched to provide for a fixed magnetic plate.

7. Spin on 4 microns of resist 31, expose with Mask 2, and develop. This mask is for the fixed magnetic plate 4 which is split and a wall of the nozzle chamber 11, for which the resist acts as an electroplating mold. This step is shown in FIG. 6.

Figure 7:
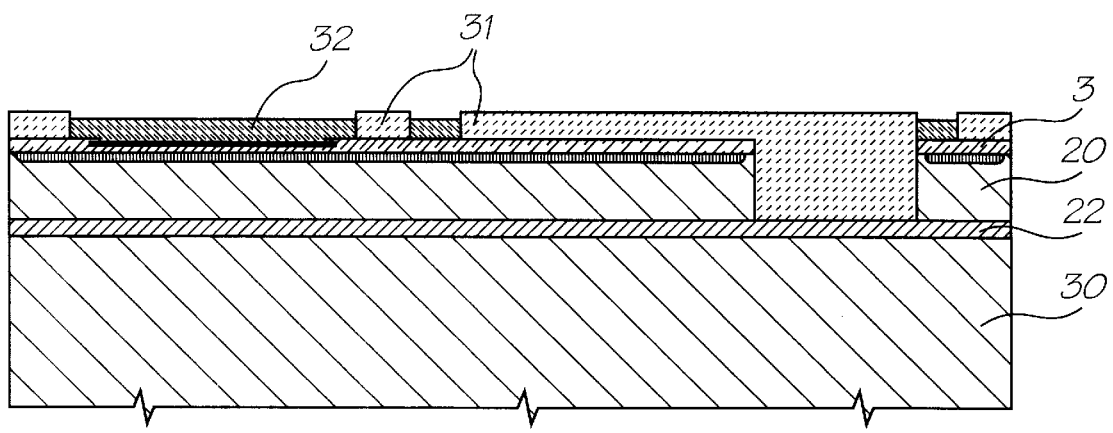
FIG. 7 shows the wafer of FIG. 6 with the fixed magnetic plate.

8. Deposit 3 microns of CoNiFe 32 by electroplating to form the fixed magnetic plate 4 and the wall of the nozzle chamber 11. This step is shown in FIG. 7.

Figure 8:
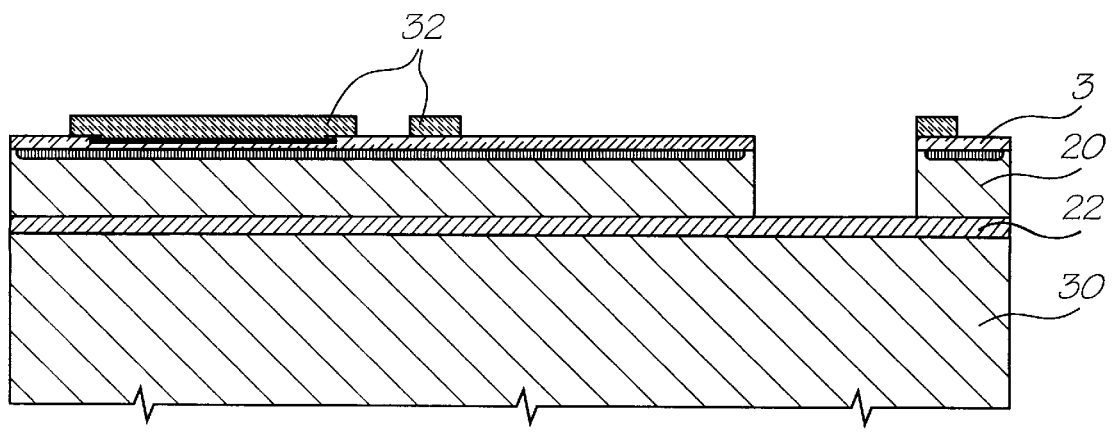
FIG. 8 shows the wafer of FIG. 7 with an exposed seed layer etched prior to depositing a silicon nitride layer.

9. Strip the resist 31 and etch the exposed seed layer. This step is shown in FIG. 8.

10. Deposit 0.1 microns of silicon nitride (Si3N4) (not shown).

11. Etch the nitride layer using Mask 3. This mask defines the contact vias from each end of the solenoid coil 2 to the two halves of the split fixed magnetic plate 4.

12. Deposit a seed layer of copper by electroplating. Copper is used for its low resistivity (which results in higher efficiency) and its high electromigration resistance, which increases reliability at high current densities.

Figure 9:
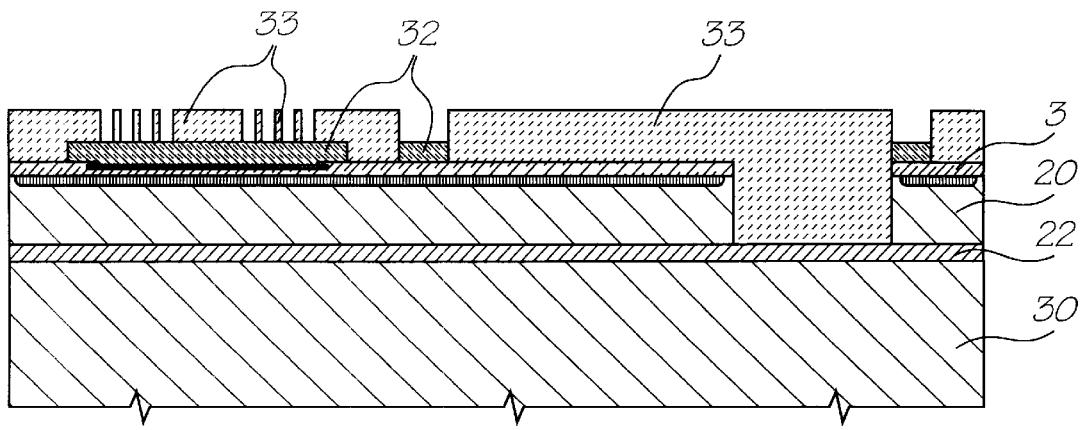
FIG. 9 shows the wafer of FIG. 8 with resist exposed with a mask for a solenoid spiral coil.

13. Spin on 5 microns of resist 33, expose with Mask 4, and develop. This mask is for the solenoid coil 2, the nozzle chamber wall and the spring posts 24, for which the resist 18 acts as an electroplating mold. This step is shown in FIG. 9.

14. Deposit 4 microns of copper 34 by electroplating to form the coil 2, the nozzle chamber wall and the spring posts 24.

Figure 10:
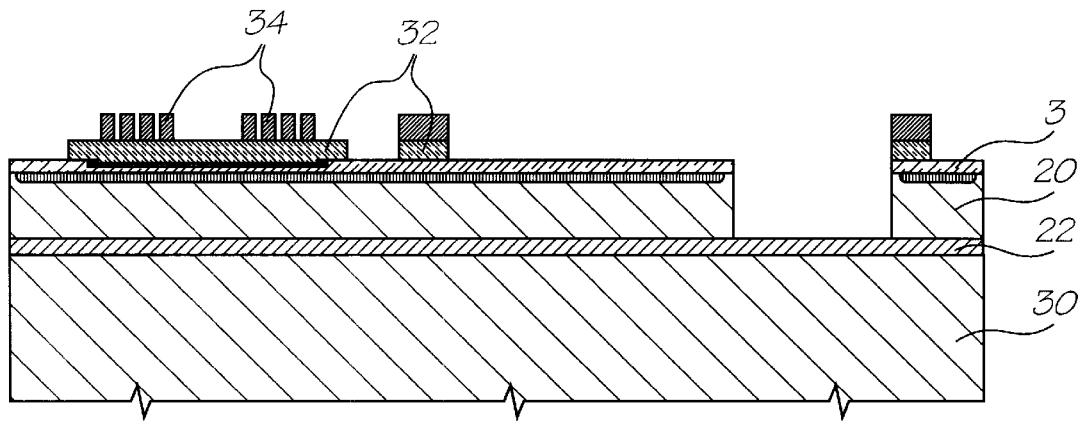
FIG. 10 shows the wafer of FIG. 9 with stripped resist and an etched copper seed layer.

15. Strip the resist 31 and etch the exposed copper seed layer. This step is shown in FIG. 10.

16. Wafer probe. All electrical connections are complete at this point, bond pads are accessible, and the chips are not yet separated.

17. Deposit 0.1 microns of silicon nitride (not shown).

18. Deposit 1 micron of sacrificial material 35. This layer determines the magnetic gap 50 (FIG. 19).

Figure 11:
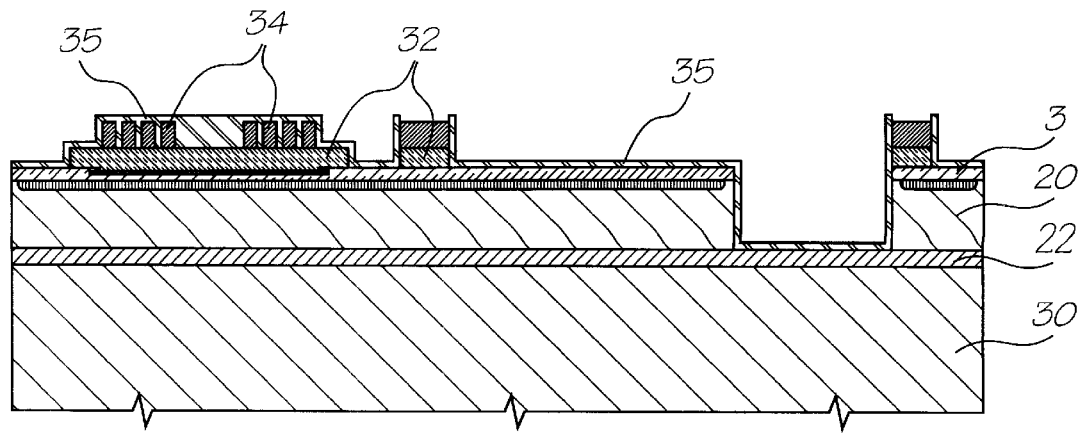
FIG. 11 shows the wafer of FIG. 10 with sacrificial layer etched for spring posts and a nozzle chamber wall.

19. Etch the sacrificial material 28 using Mask 5. This mask defines the spring posts 24 and the nozzle chamber wall. This step is shown in FIG. 11.

20. Deposit a seed layer of CoNiFe.

Figure 12:
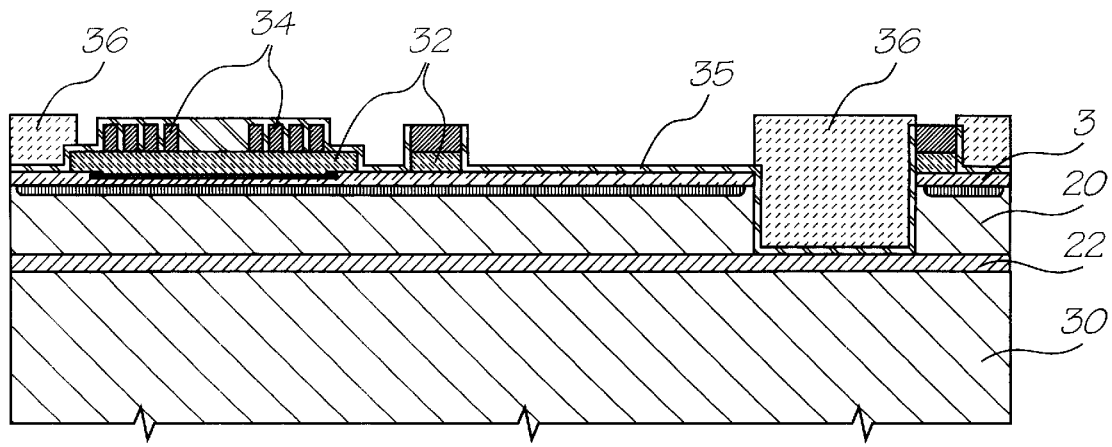
FIG. 12 shows the wafer of FIG. 11 with resist exposed with a mask for components of the ink jet nozzle.

21. Spin on 4.5 microns of resist 36, expose with Mask 6, and develop. This mask is for walls of the piston 9, the lever arm 17, the nozzle chamber wall and the spring posts 24. The resist 36 forms an electroplating mold for these parts. This step is shown in FIG. 12.

Figure 13:
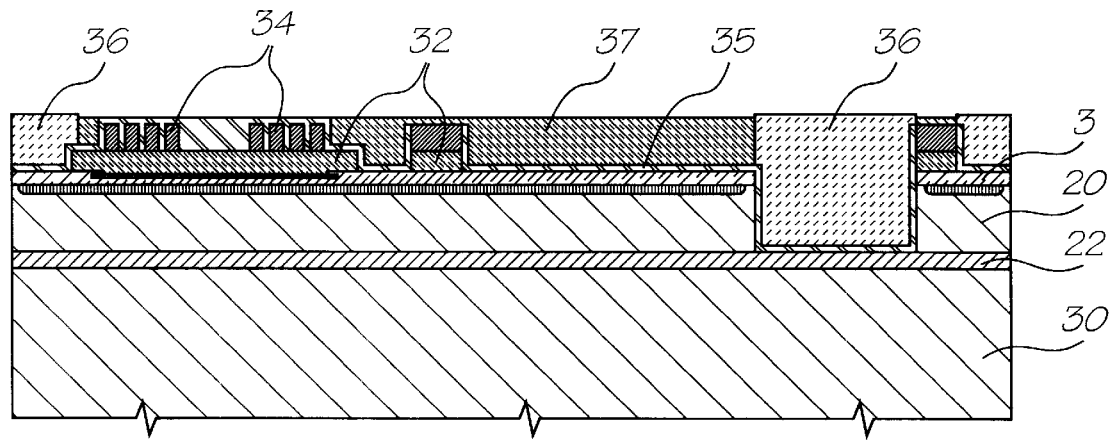
FIG. 13 shows the wafer of FIG. 12 with the components formed thereon.

22. Deposit 4 microns of CoNiFe 37 by electroplating to form the components mentioned in step 21. This step is shown in FIG. 13.

23. Deposit a seed layer of CoNiFe.

Figure 14:
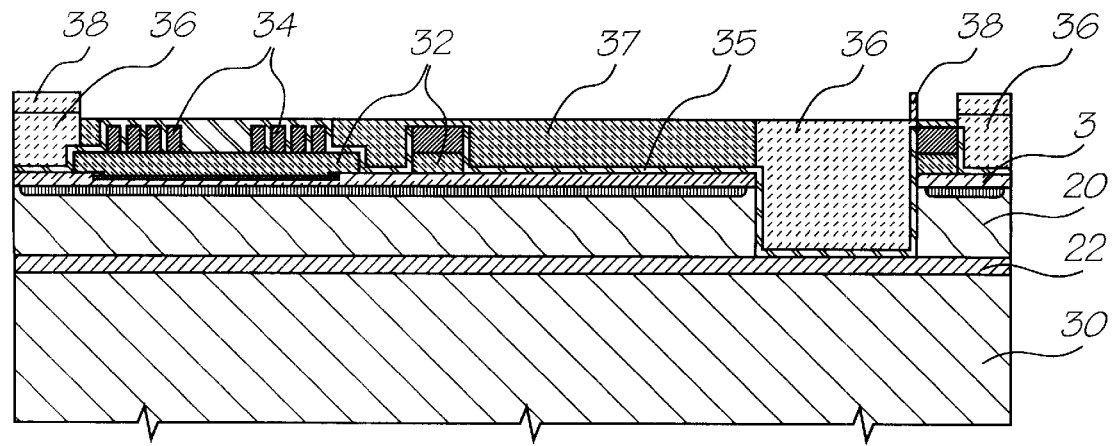
FIG. 14 shows the wafer of FIG. 13 with resist exposed with a mask for further components.

24. Spin on 4 microns of resist 38, expose with Mask 7, and develop. This mask is for a roof of the piston 9, the nozzle chamber wall, the lever arm 17, the springs 16, 19, and the spring posts 24. The resist forms an electroplating mold for these parts. This step is shown in FIG. 14.

Figure 15:
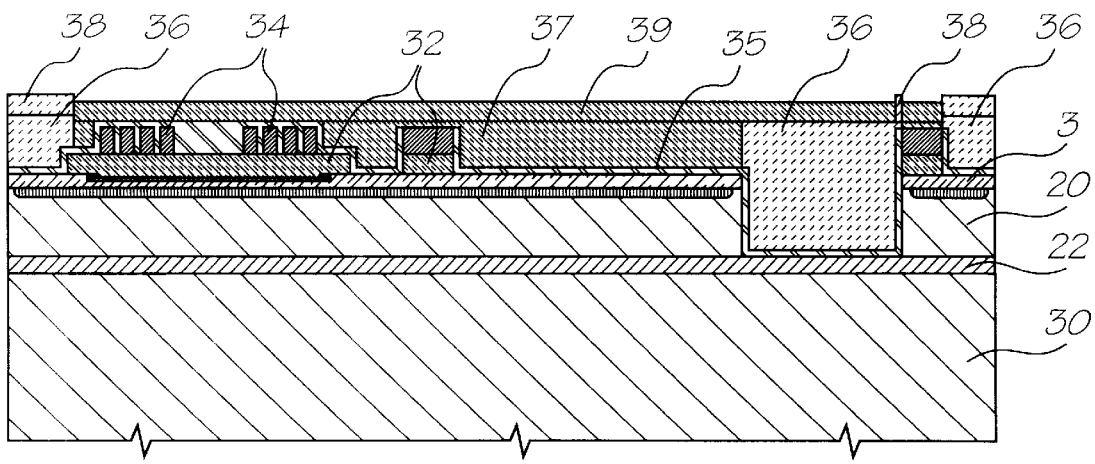
FIG. 15 shows the wafer of FIG. 14 with the components formed thereon.

25. Deposit 3 microns of CoNiFe 39 by electroplating to form the components mentioned in step 24. This step is shown in FIG. 15.

Figure 16:
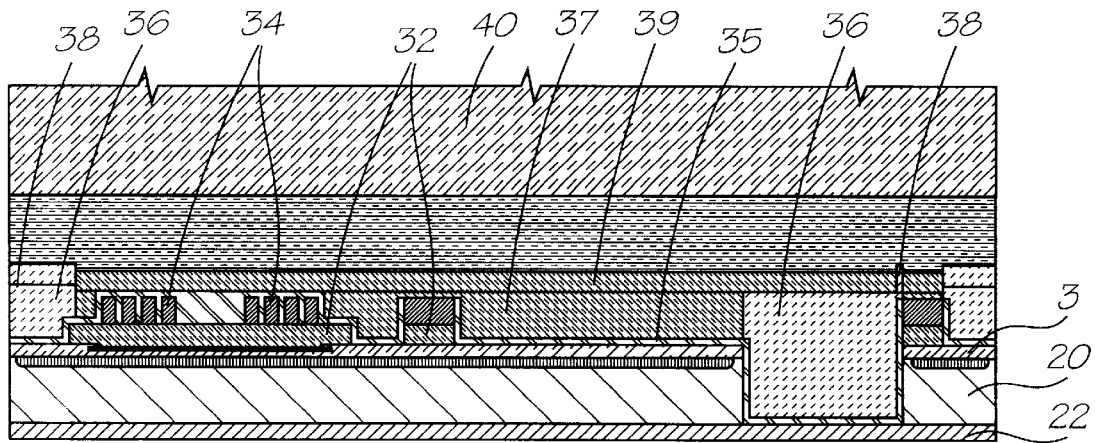
FIG. 16 shows the wafer of FIG. 15 mounted on a glass blank and back-etched.

26. Mount the wafer on a glass blank 40 and back-etch the wafer using KOH, with no mask. This etch thins the wafer and stops at the buried boron doped silicon layer 12. This step is shown in FIG. 16.

Figure 17:
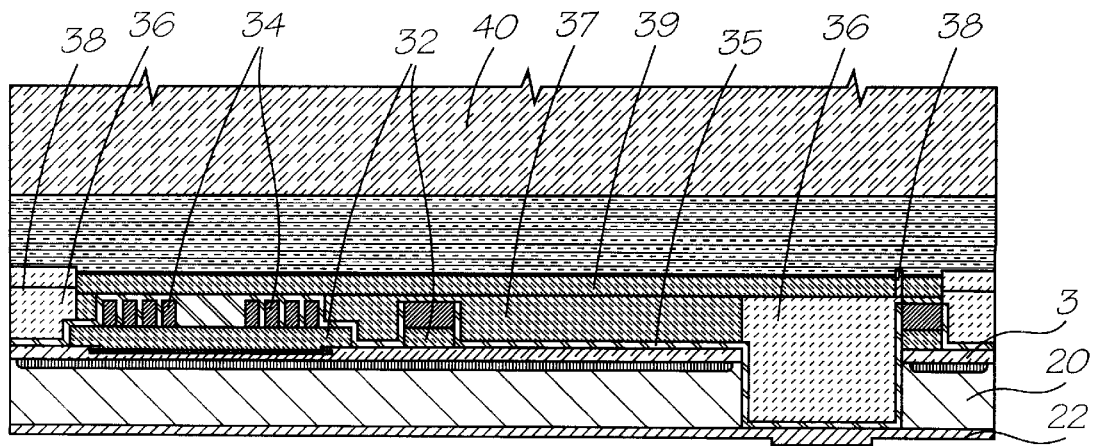
FIG. 17 shows the wafer of FIG. 16 etched with a mask for a nozzle rim.

27. Plasma back-etch the boron doped silicon layer to a depth of 1 micron using Mask 8. This mask defines a port or rim 41. This step is shown in FIG. 17.

Figure 18:
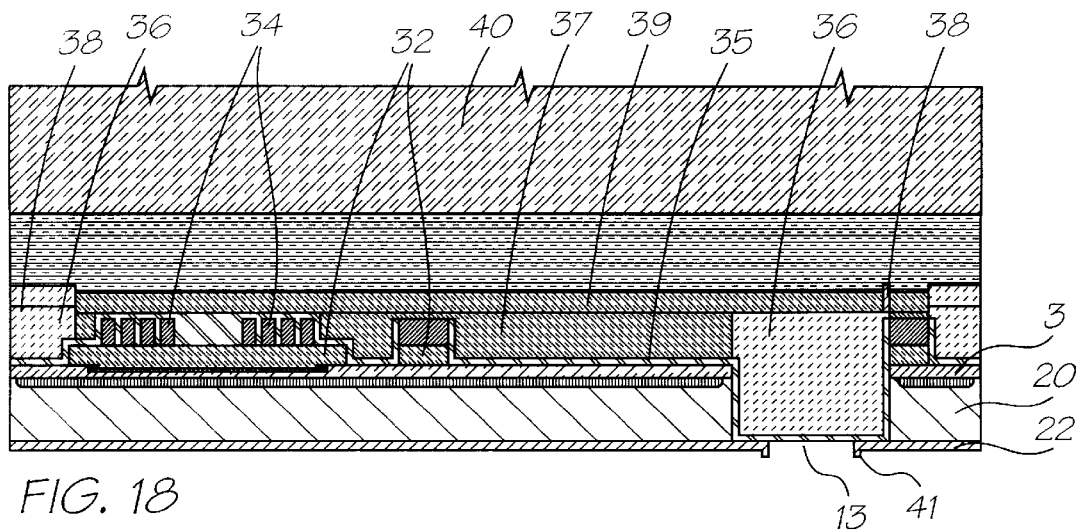
FIG. 18 shows the wafer of FIG. 17 back-etched with a mask to define an ejection port.

28. Plasma back-etch through the boron doped layer 12 using Mask 9. This mask defines the ejection port 13, and the edge of the chips. At this stage, the chips are separate, but are still mounted on the glass blank. This step is shown in FIG. 18.

29. Detach the chips from the glass blank. Strip all adhesive, resist, sacrificial, and exposed seed layers. This step is shown in FIG. 19.

30. Mount the print heads in their packaging, which may be a molded plastic former incorporating ink channels which supply different colors of ink to the appropriate regions of the front surface of the wafer.

31. Connect the printhead chips to their interconnect systems.

32. Hydrophobize the front surface of the printhead chips.

Figure 20:
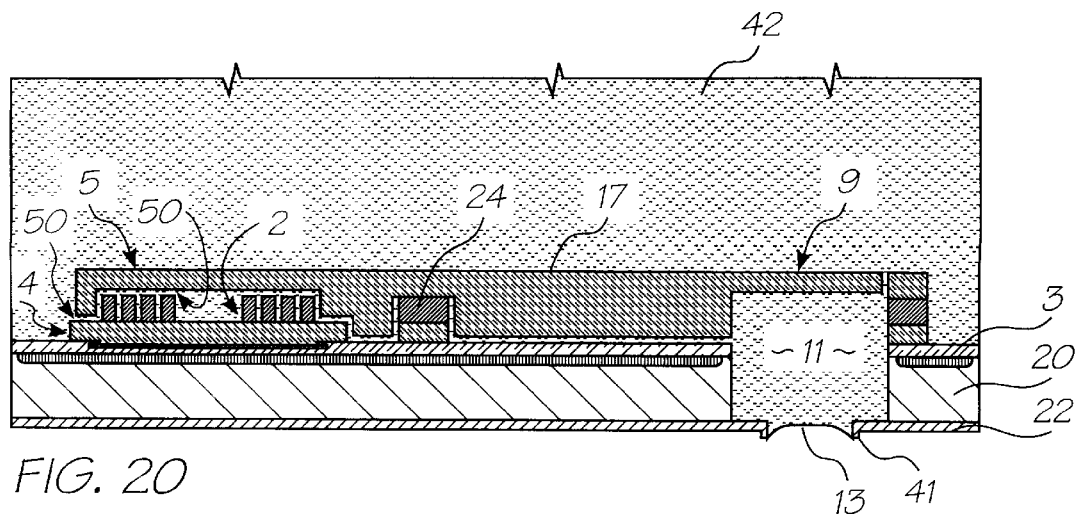
FIG. 20 shows a fabricated nozzle arrangement filled with ink.

33. Fill the completed printhead with ink 42 and test it. A filled nozzle arrangement 1 is shown in FIG. 20.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

The presently disclosed ink jet printing technology is potentially suited to a wide range of printing systems including: color and monochrome office printers, short run digital printers, high speed digital printers, offset press supplemental printers, low cost scanning printers, high speed pagewidth printers, notebook computers with in-built pagewidth printers, portable color and monochrome printers, color and monochrome copiers, color and monochrome facsimile machines, combined printer, facsimile and copying machines, label printers, large format plotters, photograph copiers, printers for digital photographic 'minilabs', video printers, PHOTO CD (PHOTO CD is a registered trade mark of Eastman Kodak Company) printers, portable printers for PDAs, wallpaper printers, indoor sign printers, billboard printers, fabric printers, camera printers and fault tolerant commercial printer arrays.

Ink Jet Technologies

The embodiments of the invention use an ink jet printer type device. Of course many different devices could be used. However presently popular ink jet printing technologies are unlikely to be suitable.

The most significant problem with thermal ink jet is power consumption. This is approximately 100 times that required for high speed, and stems from the energy-inefficient means of drop ejection. This involves the rapid boiling of water to produce a vapor bubble which expels the ink. Water has a very high heat capacity, and must be superheated in thermal ink jet applications. This leads to an efficiency of around 0.02%, from electricity input to drop momentum (and increased surface area) out.

The most significant problem with piezoelectric ink jet is size and cost. Piezoelectric crystals have a very small deflection at reasonable drive voltages, and therefore require a large area for each nozzle. Also, each piezoelectric actuator must be connected to its drive circuit on a separate substrate. This is not a significant problem at the current limit of around 300 nozzles per print head, but is a major impediment to the fabrication of pagewidth print heads with 19,200 nozzles.

Ideally, the ink jet technologies used meet the stringent requirements of in-camera digital color printing and other high quality, high speed, low cost printing applications. To meet the requirements of digital photography, new ink jet technologies have been created. The target features include:

low power (less than 10 Watts)

high resolution capability (1,600 dpi or more)

photographic quality output low manufacturing cost small size (pagewidth times minimum cross section)

high speed (<2 seconds per page).

All of these features can be met or exceeded by the ink jet systems described below with differing levels of difficulty. Forty-five different ink jet technologies have been developed by the Assignee to give a wide range of choices for high volume manufacture. These technologies form part of separate applications assigned to the present Assignee as set out in the list under the heading Cross References to Related Applications.

The ink jet designs shown here are suitable for a wide range of digital printing systems, from battery powered one-time use digital cameras, through to desktop and network printers, and through to commercial printing systems.

For ease of manufacture using standard process equipment, the print head is designed to be a monolithic 0.5 micron CMOS chip with MEMS post processing. For color photographic applications, the print head is 100 mm long, with a width which depends upon the ink jet type. The smallest print head designed is covered in U.S. patent application Ser. No. 09/112,764, which is 0.35 mm wide, giving a chip area of 35 square mm. The print heads each contain 19,200 nozzles plus data and control circuitry.

Ink is supplied to the back of the print head by injection molded plastic ink channels. The molding requires 50 micron features, which can be created using a lithographically micromachined insert in a standard injection molding tool. Ink flows through holes etched through the wafer to the nozzle chambers fabricated on the front surface of the wafer. The print head is connected to the camera circuitry by tape automated bonding.

Tables of Drop-on-Demand Ink Jets

Eleven important characteristics of the fundamental operation of individual ink jet nozzles have been identified. These characteristics are largely orthogonal, and so can be elucidated as an eleven dimensional matrix. Most of the eleven axes of this matrix include entries developed by the present assignee.

The following tables form the axes of an eleven dimensional table of ink jet types.

Actuator mechanism (18 types)

Basic operation mode (7 types)

Auxiliary mechanism (8 types)

Actuator amplification or modification method (17 types)

Actuator motion (19 types)

Nozzle refill method (4 types)

Method of restricting back-flow through inlet (10 types)

Nozzle clearing method (9 types)

Nozzle plate construction (9 types)

Drop ejection direction (5 types)

Ink type (7 types)

The complete eleven dimensional table represented by these axes contains 36.9 billion possible configurations of ink jet nozzle. While not all of the possible combinations result in a viable ink jet technology, many million configurations are viable. It is clearly impractical to elucidate all of the possible configurations. Instead, certain ink jet types have been investigated in detail. Forty-five such inkjet types were filed simultaneously to the present application.

Other ink jet configurations can readily be derived from these forty-five examples by substituting alternative configurations along one or more of the 11 axes. Most of the forty-five examples can be made into ink jet print heads with characteristics superior to any currently available ink jet technology.

Where there are prior art examples known to the inventor, one or more of these examples are listed in the examples column of the tables below. The simultaneously filed patent applications by the present applicant are listed by USSN numbers. In some cases, a print technology may be listed more than once in a table, where it shares characteristics with more than one entry.

Suitable applications for the ink jet technologies include: Home printers, Office network printers, Short run digital printers, Commercial print systems, Fabric printers, Pocket printers, Internet WWW printers, Video printers, Medical imaging, Wide format printers, Notebook PC printers, Fax machines, Industrial printing systems, Photocopiers, Photographic minilabs etc.

The information associated with the aforementioned 11 dimensional matrix are set out in the following tables.

| ACTUATOR MECHANISM (APPLIED ONLY TO SELECTED INK DROPS) | | | | |
|---|---|---|---|---|
| | Description | Advantages | Disadvantages | Examples |
| Thermal bubble | An electrothermal heater heats the ink to above boiling point, transferring significant heat to the aqueous ink. A bubble | ◆ Large force generated<br>◆ Simple construction<br>◆ No moving parts<br>◆ Fast operation | ◆ High power<br>◆ Ink carrier limited to water<br>◆ Low efficiency<br>◆ High temperatures | ◆ Canon Bubblejet 1979 Endo et al GB patent 2,007,162<br>◆ Xerox heater-in-pit 1990 Hawkins et al U.S. Pat. No. 4,899,181 |

-continued

ACTUATOR MECHANISM (APPLIED ONLY TO SELECTED INK DROPS)

| | Description | Advantages | Disadvantages | Examples |
|---|---|---|---|---|
| | nucleates and quickly forms, expelling the ink. The efficiency of the process is low, with typically less than 0.05% of the electrical energy being transformed into kinetic energy of the drop. | ◆ Small chip area required for actuator | required<br>◆ High mechanical stress<br>◆ Unusual materials required<br>◆ Large drive transistors<br>◆ Cavitation causes actuator failure<br>◆ Kogation reduces bubble formation<br>◆ Large print heads are difficult to fabricate | ◆ Hewlett-Packard TIJ 1982 Vaught et al U.S. Pat. No. 4,490,728 |
| Piezo-electric | A piezoelectric crystal such as lead lanthanum zirconate (PZT) is electrically activated, and either expands, shears, or bends to apply pressure to the ink, ejecting drops. | ◆ Low power consumption<br>◆ Many ink types can be used<br>◆ Fast operation<br>◆ High efficiency | ◆ Very large area required for actuator<br>◆ Difficult to integrate with electronics<br>◆ High voltage drive transistors required<br>◆ Full pagewidth print heads impractical due to actuator size<br>◆ Requires electrical poling in high field strengths during manufacture | ◆ Kyser et al U.S. Pat. No. 3,946,398<br>◆ Zoltan U.S. Pat. No. 3,683,212<br>◆ 1973 Stemme U.S. Pat. No. 3,747,120<br>◆ Epson Stylus<br>◆ Tektronix<br>◆ IJ04 |
| Electro-strictive | An electric field is used to activate electrostriction in relaxor materials such as lead lanthanum zirconate titanate (PLZT) or lead magnesium niobate (PMN). | ◆ Low power consumption<br>◆ Many ink types can be used<br>◆ Low thermal expansion<br>◆ Electric field strength required (approx. 3.5 V/$\mu$m) can be generated without difficulty<br>◆ Does not require electrical poling | ◆ Low maximum strain (approx. 0.01%)<br>◆ Large area required for actuator due to low strain<br>◆ Response speed is marginal (~10 $\mu$s)<br>◆ High voltage drive transistors required<br>◆ Full pagewidth print heads impractical due to actuator size | ◆ Seiko Epson, Usui et all JP 253401/96<br>◆ IJ04 |
| Ferro-electric | An electric field is used to induce a phase transition between the antiferroelectric (AFE) and ferroelectric (FE) phase. Perovskite materials such as tin modified lead lanthanum zirconate titanate (PLZSnT) exhibit large strains of up to 1% associated with the AFE to FE phase transition. | ◆ Low power consumption<br>◆ Many ink types can be used<br>◆ Fast operation (<1 $\mu$s)<br>◆ Relatively high longitudinal strain<br>◆ High efficiency<br>◆ Electric field strength of around 3 V/$\mu$m can be readily provided | ◆ Difficult to integrate with electronics<br>◆ Unusual materials such as PLZSnT are required<br>◆ Actuators require a large area | ◆ IJ04 |
| Electro-static plates | Conductive plates are separated by a compressible or fluid dielectric (usually air). Upon application of a voltage, the plates attract each other and displace ink, causing drop ejection. The conductive plates may be in a comb or honeycomb structure, or stacked to increase the surface area and therefore the force. | ◆ Low power consumption<br>◆ Many ink types can be used<br>◆ Fast operation | ◆ Difficult to operate electrostatic devices in an aqueous environment<br>◆ The electrostatic actuator will normally need to be separated from the ink<br>◆ Very large area required to achieve high forces<br>◆ High voltage drive transistors | ◆ IJ02, IJ04 |

-continued

ACTUATOR MECHANISM (APPLIED ONLY TO SELECTED INK DROPS)

| | Description | Advantages | Disadvantages | Examples |
|---|---|---|---|---|
| | | | may be required<br>• Full pagewidth print heads are not competitive due to actuator size | |
| Electrostatic pull on ink | A strong electric field is applied to the ink, whereupon electrostatic attraction accelerates the ink towards the print medium. | • Low current consumption<br>• Low temperature | • High voltage required<br>• May be damaged by sparks due to air breakdown<br>• Required field strength increases as the drop size decreases<br>• High voltage drive transistors required<br>• Electrostatic field attracts dust | • 1989 Saito et al, U.S. Pat. No. 4,799,068<br>• 1989 Miura et al, U.S. Pat. No. 4,810,954<br>• Tone-jet |
| Permanent magnet electromagnetic | An electromagnet directly attracts a permanent magnet, displacing ink and causing drop ejection. Rare earth magnets with a field strength around 1 Tesla can be used. Examples are: Samarium Cobalt (SaCo) and magnetic materials in the neodymium iron boron family (NdFeB, NdDyFeBNb, NdDyFeB, etc) | • Low power consumption<br>• Many ink types can be used<br>• Fast operation<br>• High efficiency<br>• Easy extension from single nozzles to pagewidth print heads | • Complex fabrication<br>• Permanent magnetic material such as Neodymium Iron Boron (NdFeB) required.<br>• High local currents required<br>• Copper metalization should be used for long electromigration lifetime and low resistivity<br>• Pigmented inks are usually infeasible<br>• Operating temperature limited to the Curie temperature (around 540K) | • IJ07, IJ10 |
| Soft magnetic core electromagnetic | A solenoid induced a magnetic field in a soft magnetic core or yoke fabricated from a ferrous material such as electroplated iron alloys such as CoNiFe [1], CoFe, or NiFe alloys. Typically, the soft magnetic material is in two parts, which are normally held apart by a spring. When the solenoid is actuated, the two parts attract, displacing the ink. | • Low power consumption<br>• Many ink types can be used<br>• Fast operation<br>• High efficiency<br>• Easy extension from single nozzles to pagewidth print heads<br>• | • Complex fabrication<br>• Materials not usually present in a CMOS fab such as NiFe, CoNiFe, or CoFe are required<br>• High local currents required<br>• Copper metalization should be used for long electromigration lifetime and low resistivity<br>• Electroplating is required<br>• High saturation flux density is required (2.0–2.1 T is achievable with CoNiFe [1]) | • IJ01, IJ05, IJ08, IJ10, IJ12, IJ14, IJ15, IJ17 |
| Lorenz force | The Lorenz force acting on a current carrying wire in a magnetic field is utilized.<br>This allows the magnetic field to be supplied externally to the print head, for example with rare earth permanent | • Low power consumption<br>• Many ink types can be used<br>• Fast operation<br>• High efficiency<br>• Easy extension from single nozzles to pagewidth print heads | • Force acts as a twisting motion<br>• Typically, only a quarter of the solenoid length provides force in a useful direction<br>• High local currents required<br>• Copper metalization should | • IJ06, IJ11, IJ13, IJ16 |

-continued

ACTUATOR MECHANISM (APPLIED ONLY TO SELECTED INK DROPS)

| | Description | Advantages | Disadvantages | Examples |
|---|---|---|---|---|
| | magnets. Only the current carrying wire need be fabricated on the printhead, simplifying materials requirements. | | be used for long electromigration lifetime and low resistivity<br>♦ Pigmented inks are usually infeasible | |
| Magneto-striction | The actuator uses the giant magnetostrictive effect of materials such as Terfenol-D (an alloy of terbium, dysprosium and iron developed at the Naval Ordnance Laboratory, hence Ter-Fe-NOL). For best efficiency, the actuator should be pre-stressed to approx. 8 MPa. | ♦ Many ink types can be used<br>♦ Fast operation<br>♦ Easy extension from single nozzles to pagewidth print heads<br>♦ High force is available | ♦ Force acts as a twisting motion<br>♦ Unusual materials such as Terfenol-D are required<br>♦ High local currents required<br>♦ Copper metalization should be used for long electromigration lifetime and low resistivity<br>♦ Pre-stressing may be required | ♦ Fischenbeck, U.S. Pat. No. 4,032,929<br>♦ IJ25 |
| Surface tension reduction | Ink under positive pressure is held in a nozzle by surface tension. The surface tension of the ink is reduced below the bubble threshold, causing the ink to egress from the nozzle. | ♦ Low power consumption<br>♦ Simple construction<br>♦ No unusual materials required in fabrication<br>♦ High efficiency<br>♦ Easy extension from single nozzles to pagewidth print heads | ♦ Requires supplementary force to effect drop separation<br>♦ Requires special ink surfactants<br>♦ Speed may be limited by surfactant properties | ♦ Silverbrook, EP 0771 658 A2 and related patent applications |
| Viscosity reduction | The ink viscosity is locally reduced to select which drops are to be ejected. A viscosity reduction can be achieved electrothermally with most inks, but special inks can be engineered for a 100:1 viscosity reduction. | ♦ Simple construction<br>♦ No unusual materials required in fabrication<br>♦ Easy extension from single nozzles to pagewidth print heads | ♦ Requires supplementary force to effect drop separation<br>♦ Requires special ink viscosity properties<br>♦ High speed is difficult to achieve<br>♦ Requires oscillating ink pressure<br>♦ A high temperature difference (typically 80 degrees) is required | ♦ Silverbrook, EP 0771 658 A2 and related patent applications |
| Acoustic | An acoustic wave is generated and focussed upon the drop ejection region. | ♦ Can operate without a nozzle plate | ♦ Complex drive circuitry<br>♦ Complex fabrication<br>♦ Low efficiency<br>♦ Poor control of drop position<br>♦ Poor control of drop volume | ♦ 1993 Hadimioglu et al, EUP 550,192<br>♦ 1993 Elrod et al, EUP 572,220 |
| Thermo-elastic bend actuator | An actuator which relies upon differential thermal expansion upon Joule heating is used. | ♦ Low power consumption<br>♦ Many ink types can be used<br>♦ Simple planar fabrication<br>♦ Small chip area required for each actuator<br>♦ Fast operation<br>♦ High efficiency<br>♦ CMOS compatible voltages and currents | ♦ Efficient aqueous operation requires a thermal insulator on the hot side<br>♦ Corrosion prevention can be difficult<br>♦ Pigmented inks may be infeasible, as pigment particles may jam the bend actuator | ♦ IJ03, IJ09, IJ17, IJ18, IJ19, IJ20, IJ21, IJ22, IJ23, IJ24, IJ27, IJ28, IJ29, IJ30, IJ31, IJ32, IJ33, IJ34, IJ35, IJ36, IJ37, IJ38, IJ39, IJ40, IJ41 |

ACTUATOR MECHANISM (APPLIED ONLY TO SELECTED INK DROPS)

| | Description | Advantages | Disadvantages | Examples |
|---|---|---|---|---|
| | | ◆ Standard MEMS processes can be used<br>◆ Easy extension from single nozzles to pagewidth print heads | | |
| High CTE thermo-elastic actuator | A material with a very high coefficient of thermal expansion (CTE) such as polytetrafluoroethylene (PTFE) is used. As high CTE materials are usually non-conductive, a heater fabricated from a conductive material is incorporated. A 50 μm long PTFE bend actuator with polysilicon heater and 15 mW power input can provide 180 μN force and 10 μm deflection. Actuator motions include:<br>Bend<br>Push<br>Buckle<br>Rotate | ◆ High force can be generated<br>◆ Three methods of PTFE deposition are under development: chemical vapor deposition (CVD), spin coating, and evaporation<br>◆ PTFE is a candidate for low dielectric constant insulation in ULSI<br>◆ Very low power consumption<br>◆ Many ink types can be used<br>◆ Simple planar fabrication<br>◆ Small chip area required for each actuator<br>◆ Fast operation<br>◆ High efficiency<br>◆ CMOS compatible voltages and currents<br>◆ Easy extension from single nozzles to pagewidth print heads | ◆ Requires special material (e.g. PTFE)<br>◆ Requires a PTFE deposition process, which is not yet standard in ULSI fabs<br>◆ PTFE deposition cannot be followed with high temperature (above 350° C.) processing<br>◆ Pigmented inks may be infeasible, as pigment particles may jam the bend actuator | ◆ IJ09, IJ17, IJ18, IJ20, IJ21, IJ22, IJ23, IJ24, IJ27, IJ28, IJ29, IJ30, IJ31, IJ42, IJ43, IJ44 |
| Conductive polymer thermo-elastic actuator | A polymer with a high coefficient of thermal expansion (such as PTFE) is doped with conducting substances to increase its conductivity to about 3 orders of magnitude below that of copper. The conducting polymer expands when resistively heated.<br>Examples of conducting dopants include:<br>Carbon nanotubes<br>Metal fibers<br>Conductive polymers such as doped polythiophene<br>Carbon granules | ◆ High force can be generated<br>◆ Very low power consumption<br>◆ Many ink types can be used<br>◆ Simple planar fabrication<br>◆ Small chip area required for each actuator<br>◆ Fast operation<br>◆ High efficiency<br>◆ CMOS compatible voltages and currents<br>◆ Easy extension from single nozzles to pagewidth print heads | ◆ Requires special materials development (High CTE conductive polymer)<br>◆ Requires a PTFE deposition process, which is not yet standard in ULSI fabs<br>◆ PTFE deposition cannot be followed with high temperature (above 350° C.) processing<br>◆ Evaporation and CVD deposition techniques cannot be used<br>◆ Pigmented inks may be infeasible, as pigment particles may jam the bend actuator | ◆ IJ24 |
| Shape memory alloy | A shape memory alloy such as TiNi (also known as Nitinol — Nickel Titanium alloy developed at the Naval Ordnance Laboratory) is thermally switched between its weak martensitic state and its high stiffness austenic state. The shape of the actuator in its martensitic state | ◆ High force is available (stresses of hundreds of MPa)<br>◆ Large strain is available (more than 3%)<br>◆ High corrosion resistance<br>◆ Simple construction<br>◆ Easy extension from single nozzles to pagewidth print | ◆ Fatigue limits maximum number of cycles<br>◆ Low strain (1%) is required to extend fatigue resistance<br>◆ Cycle rate limited by heat removal<br>◆ Requires unusual materials (TiNi)<br>◆ The latent heat of transformation must | ◆ IJ26 |

-continued

ACTUATOR MECHANISM (APPLIED ONLY TO SELECTED INK DROPS)

| | Description | Advantages | Disadvantages | Examples |
|---|---|---|---|---|
| | is deformed relative to the austenic shape. The shape change causes ejection of a drop. | heads<br>♦ Low voltage operation | be provided<br>♦ High current operation<br>♦ Requires pre-stressing to distort the martensitic state | |
| Linear Magnetic Actuator | Linear magnetic actuators include the Linear Induction Actuator (LIA), Linear Permanent Magnet Synchronous Actuator (LPMSA), Linear Reluctance Synchronous Actuator (LRSA), Linear Switched Reluctance Actuator (LSRA), and the Linear Stepper Actuator (LSA). | ♦ Linear Magnetic actuators can be constructed with high thrust, long travel, and high efficiency using planar semiconductor fabrication techniques<br>♦ Long actuator travel is available<br>♦ Medium force is available<br>♦ Low voltage operation | ♦ Requires unusual semiconductor materials such as soft magnetic alloys (e.g. CoNiFe)<br>♦ Some varieties also require permanent magnetic materials such as Neodymium iron boron (NdFeB)<br>♦ Requires complex multi-phase drive circuitry<br>♦ High current operation | ♦ IJ12 |

BASIC OPERATION MODE

| | Description | Advantages | Disadvantages | Examples |
|---|---|---|---|---|
| Actuator directly pushes ink | This is the simplest mode of operation: the actuator directly supplies sufficient kinetic energy to expel the drop. The drop must have a sufficient velocity to overcome the surface tension. | ♦ Simple operation<br>♦ No external fields required<br>♦ Satellite drops can be avoided if drop velocity is less than 4 m/s<br>♦ Can be efficient, depending upon the actuator used | ♦ Drop repetition rate is usually limited to around 10 kHz. However, this is not fundamental to the method, but is related to the refill method normally used<br>♦ All of the drop kinetic energy must be provided by the actuator<br>♦ Satellite drops usually form if drop velocity is greater than 4.5 m/s | ♦ Thermal ink jet<br>♦ Piezoelectric ink jet<br>♦ IJ01, IJ02, IJ03, IJ04, IJ05, IJ06, IJ07, IJ09, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Proximity | The drops to be printed are selected by some manner (e.g. thermally induced surface tension reduction of pressurized ink). Selected drops are separated from the ink in the nozzle by contact with the print medium or a transfer roller. | ♦ Very simple print head fabrication can be used<br>♦ The drop selection means does not need to provide the energy required to separate the drop from the nozzle | ♦Requires close proximity between the print head and the print media or transfer roller<br>♦ May require two print heads printing alternate rows of the image<br>♦ Monolithic color print heads are difficult | ♦ Silverbrook, EP 0771 658 A2 and related patent applications |
| Electro-static pull on ink | The drops to be printed are selected by some manner (e.g. thermally induced surface tension reduction of pressurized ink). Selected drops are separated from the ink in the nozzle by a strong electric field. | ♦ Very simple print head fabrication can be used<br>♦ The drop selection means does not need to provide the energy required to separate the drop from the nozzle | ♦ Requires very high electrostatic field<br>♦ Electrostatic field for small nozzle sizes is above air breakdown<br>♦ Electrostatic field may attract dust | ♦ Silverbrook, EP 0771 658 A2 and related patent applications<br>♦ Tone-Jet |
| Magnetic pull on ink | The drops to be printed are selected by | ♦ Very simple print head fabrication can | ♦ Requires magnetic ink | ♦ Silverbrook, EP 0771 658 A2 and |

BASIC OPERATION MODE

| | Description | Advantages | Disadvantages | Examples |
|---|---|---|---|---|
| | some manner (e.g. thermally induced surface tension reduction of pressurized ink). Selected drops are separated from the ink in the nozzle by a strong magnetic field acting on the magnetic ink. | be used<br>♦ The drop selection means does not need to provide the energy required to separate the drop from the nozzle | ♦ Ink colors other than black are difficult<br>♦ Requires very high magnetic fields | related patent applications |
| Shutter | The actuator moves a shutter to block ink flow to the nozzle. The ink pressure is pulsed at a multiple of the drop ejection frequency. | ♦ High speed (>50 kHz) operation can be achieved due to reduced refill time<br>♦ Drop timing can be very accurate<br>♦ The actuator energy can be very low | ♦ Moving parts are required<br>♦ Requires ink pressure modulator<br>♦ Friction and wear must be considered<br>♦ Stiction is possible | ♦ IJ13, IJ17, IJ21 |
| Shuttered grill | The actuator moves a shutter to block ink flow through a grill to the nozzle. The shutter movement need only be equal to the width of the grill holes. | ♦ Actuators with small travel can be used<br>♦ Actuators with small force can be used<br>♦ High speed (>50 kHz) operation can be achieved | ♦ Moving parts are required<br>♦ Requires ink pressure modulator<br>♦ Friction and wear must be considered<br>♦ Stiction is possible | ♦ IJ08, IJ15, IJ18, IJ19 |
| Pulsed magnetic pull on ink pusher | A pulsed magnetic field attracts an 'ink pusher' at the drop ejection frequency. An actuator controls a catch, which prevents the ink pusher from moving when a drop is not to be ejected. | ♦ Extremely low energy operation is possible<br>♦ No heat dissipation problems | ♦ Requires an external pulsed magnetic field<br>♦ Requires special materials for both the actuator and the ink pusher<br>♦ Complex construction | ♦ IJ10 |

AUXILIARY MECHANISM (APPLIED TO ALL NOZZLES)

| | Description | Advantages | Disadvantages | Examples |
|---|---|---|---|---|
| None | The actuator directly fires the ink drop, and there is no external field or other mechanism required. | ♦ Simplicity of construction<br>♦ Simplicity of operation<br>♦ Small physical size | ♦ Drop ejection energy must be supplied by individual nozzle actuator | ♦ Most ink jets, including piezoelectric and thermal bubble.<br>♦ IJ01, IJ02, IJ03, IJ04, IJ05, IJ07, IJ09, IJ11, IJ12, IJ14, IJ20, IJ22, IJ23, IJ24, IJ25, IJ26, IJ27, IJ28, IJ29, IJ30, IJ31, IJ32, IJ33, IJ34, IJ35, IJ36, IJ37, IJ38, IJ39, IJ40, IJ41, IJ42, IJ43, IJ44 |
| Oscillating ink pressure (including acoustic stimulation) | The ink pressure oscillates, providing much of the drop ejection energy. The actuator selects which drops are to be fired by selectively blocking or enabling nozzles. The ink pressure oscillation may be achieved by | ♦ Oscillating ink pressure can provide a refill pulse, allowing higher operating speed<br>♦ The actuators may operate with much lower energy<br>♦ Acoustic lenses can be used to focus the sound on the | ♦ Requires external ink pressure oscillator<br>♦ Ink pressure phase and amplitude must be carefully controlled<br>♦ Acoustic reflections in the ink chamber must be designed for | ♦ Silverbrook, EP 0771 658 A2 and related patent applications<br>♦ IJ08, IJ13, IJ15, IJ17, IJ18, IJ19, IJ21 |

AUXILIARY MECHANISM (APPLIED TO ALL NOZZLES)

|  | Description | Advantages | Disadvantages | Examples |
|---|---|---|---|---|
|  | vibrating the print head, or preferably by an actuator in the ink supply. | nozzles |  |  |
| Media proximity | The print head is placed in close proximity to the print medium. Selected drops protrude from the print head further than unselected drops, and contact the print medium. The drop soaks into the medium fast enough to cause drop separation. | ◆ Low power<br>◆ High accuracy<br>◆ Simple print head construction | ◆ Precision assembly required<br>◆ Paper fibers may cause problems<br>◆ Cannot print on rough substrates | ◆ Silverbrook, EP 0771 658 A2 and related patent applications |
| Transfer roller | Drops are printed to a transfer roller instead of straight to the print medium. A transfer roller can also be used for proximity drop separation. | ◆ High accuracy<br>◆ Wide range of print substrates can be used<br>◆ Ink can be dried on the transfer roller | ◆ Bulky<br>◆ Expensive<br>◆ Complex construction | ◆ Silverbrook, EP 0771 658 A2 and related patent applications<br>◆ Tektronix hot melt piezoelectric ink jet<br>◆ Any of the IJ series |
| Electrostatic | An electric field is used to accelerate selected drops towards the print medium. | ◆ Low power<br>◆ Simple print head construction | ◆ Field strength required for separation of small drops is near or above air breakdown | ◆ Silverbrook, EP 0771 658 A2 and related patent applications<br>◆ Tone-Jet |
| Direct magnetic field | A magnetic field is used to accelerate selected drops of magnetic ink towards the print medium. | ◆ Low power<br>◆ Simple print head construction | ◆ Requires magnetic ink<br>◆ Requires strong magnetic field | ◆ Silverbrook, EP 0771 658 A2 and related patent applications |
| Cross magnetic field | The print head is placed in a constant magnetic field. The Lorenz force in a current carrying wire is used to move the actuator. | ◆ Does not require magnetic materials to be integrated in the print head manufacturing process | ◆ Requires external magnet<br>◆ Current densities may be high, resulting in electromigration problems | ◆ IJ06, IJ16 |
| Pulsed magnetic field | A pulsed magnetic field is used to cyclically attract a paddle, which pushes on the ink. A small actuator moves a catch, which selectively prevents the paddle from moving. | ◆ Very low power operation is possible<br>◆ Small print head size | ◆ Complex print head construction<br>◆ Magnetic materials required in print head | ◆ IJ10 |

ACTUATOR AMPLIFICATION OR MODIFICATION METHOD

|  | Description | Advantages | Disadvantages | Examples |
|---|---|---|---|---|
| None | No actuator mechanical amplification is used. The actuator directly drives the drop ejection process. | ◆ Operational simplicity | ◆ Many actuator mechanisms have insufficient travel, or insufficient force, to efficiently drive the drop ejection process | ◆ Thermal Bubble Ink jet<br>◆ IJ01, IJ02, IJ06, IJ07, IJ16, IJ25, IJ26 |
| Differential expansion bend actuator | An actuator material expands more on one side than on the other. The expansion may be thermal, piezoelectric, | ◆ Provides greater travel in a reduced print head area | ◆ High stresses are involved<br>◆ Care must be taken that the materials do not | ◆ Piezoelectric<br>◆ IJ03, IJ09, IJ17, IJ18, IJ19, IJ20, IJ21, IJ22, IJ23, IJ24, IJ27, IJ29, |

-continued

ACTUATOR AMPLIFICATION OR MODIFICATION METHOD

| | Description | Advantages | Disadvantages | Examples |
|---|---|---|---|---|
| | magnetostrictive, or other mechanism. The bend actuator converts a high force low travel actuator mechanism to high travel, lower force mechanism. | | delaminate<br>♦ Residual bend resulting from high temperature or high stress during formation | IJ30, IJ31, IJ32, IJ33, IJ34, IJ35, IJ36, IJ37, IJ38, IJ39, IJ42, IJ43, IJ44 |
| Transient bend actuator | A trilayer bend actuator where the two outside layers are identical. This cancels bend due to ambient temperature and residual stress. The actuator only responds to transient heating of one side or the other. | ♦ Very good temperature stability<br>♦ High speed, as a new drop can be fired before heat dissipates<br>♦ Cancels residual stress of formation | ♦ High stresses are involved<br>♦ Care must be taken that the materials do not delaminate | ♦ IJ40, IJ41 |
| Reverse spring | The actuator loads a spring. When the actuator is turned off, the spring releases. This can reverse the force/distance curve of the actuator to make it compatible with the force/time requirements of the drop ejection. | ♦ Better coupling to the ink | ♦ Fabrication complexity<br>♦ High stress in the spring | ♦ IJ05, IJ11 |
| Actuator stack | A series of thin actuators are stacked. This can be appropriate where actuators require high electric field strength, such as electrostatic and piezoelectric actuators. | ♦ Increased travel<br>♦ Reduced drive voltage | ♦ Increased fabrication complexity<br>♦ Increased possibility of short circuits due to pinholes | ♦ Some piezoelectric ink jets<br>♦ IJ04 |
| Multiple actuators | Multiple smaller actuators are used simultaneously to move the ink. Each actuator need provide only a portion of the force required. | ♦ Increases the force available from an actuator<br>♦ Multiple actuators can be positioned to control ink flow accurately | ♦ Actuator forces may not add linearly, reducing efficiency | ♦ IJ12, IJ13, IJ18, IJ20, IJ22, IJ28, IJ42, IJ43 |
| Linear Spring | A linear spring is used to transform a motion with small travel and high force into a longer travel, lower force motion. | ♦ Matches low travel actuator with higher travel requirements<br>♦ Non-contact method of motion transformation | ♦ Requires print head area for the spring | ♦ IJ15 |
| Coiled actuator | A bend actuator is coiled to provide greater travel in a reduced chip area. | ♦ Increases travel<br>♦ Reduces chip area<br>♦ Planar implementations are relatively easy to fabricate. | ♦ Generally restricted to planar implementations due to extreme fabrication difficulty in other orientations. | ♦ IJ17, IJ21, IJ34, IJ35 |
| Flexure bend actuator | A bend actuator has a small region near the fixture point, which flexes much more readily than the remainder of the actuator. The actuator flexing is effectively converted from an even coiling to an angular bend, resulting in greater travel of the actuator tip. | ♦ Simple means of increasing travel of a bend actuator | ♦ Care must be taken not to exceed the elastic limit in the flexure area<br>♦ Stress distribution is very uneven<br>♦ Difficult to accurately model with finite element analysis | ♦ IJ10, IJ19, IJ33 |
| Catch | The actuator controls a small catch. The catch either enables or disables movement of | ♦ Very low actuator energy<br>♦ Very small actuator size | ♦ Complex construction<br>♦ Requires external force | ♦ IJ10 |

-continued

ACTUATOR AMPLIFICATION OR MODIFICATION METHOD

| | Description | Advantages | Disadvantages | Examples |
|---|---|---|---|---|
| | an ink pusher that is controlled in a bulk manner. | | ♦ Unsuitable for pigmented inks | |
| Gears | Gears can be used to increase travel at the expense of duration. Circular gears, rack and pinion, ratchets, and other gearing methods can be used. | ♦ Low force, low travel actuators can be used<br>♦ Can be fabricated using standard surface MEMS processes | ♦ Moving parts are required<br>♦ Several actuator cycles are required<br>♦ More complex drive electronics<br>♦ Complex construction<br>♦ Friction, friction, and wear are possible | ♦ IJ13 |
| Buckle plate | A buckle plate can be used to change a slow actuator into a fast motion. It can also convert a high force, low travel actuator into a high travel, medium force motion. | ♦ Very fast movement achievable | ♦ Must stay within elastic limits of the materials for long device life<br>♦ High stresses involved<br>♦ Generally high power requirement | ♦ S. Hirata et al, "An Ink-jet Head Using Diaphragm Microactuator", Proc. IEEE MEMS, Feb. 1996, pp 418–423.<br>♦ IJ18, IJ27 |
| Tapered magnetic pole | A tapered magnetic pole can increase travel at the expense of force. | ♦ Linearizes the magnetic force/distance curve | ♦ Complex construction | ♦ IJ14 |
| Lever | A lever and fulcrum is used to transform a motion with small travel and high force into a motion with longer travel and lower force. The lever can also reverse the direction of travel. | ♦ Matches low travel actuator with higher travel requirements<br>♦ Fulcrum area has no linear movement, and can be used for a fluid seal | ♦ High stress around the fulcrum | ♦ IJ32, IJ36, IJ37 |
| Rotary impeller | The actuator is connected to a rotary impeller. A small angular deflection of the actuator results in a rotation of the impeller vanes, which push the ink against stationary vanes and out of the nozzle. | ♦ High mechanical advantage<br>♦ The ratio of force to travel of the actuator can be matched to the nozzle requirements by varying the number of impeller vanes | ♦ Complex construction<br>♦ Unsuitable for pigmented inks | ♦ IJ28 |
| Acoustic lens | A refractive or diffractive (e.g. zone plate) acoustic lens is used to concentrate sound waves. | ♦ No moving parts | ♦ Large area required<br>♦ Only relevant for acoustic ink jets | ♦ 1993 Hadimioglu et al, EUP 550,192<br>♦ 1993 Elrod et al, EUP 572,220 |
| Sharp conductive point | A sharp point is used to concentrate an electrostatic field. | ♦ Simple construction | ♦ Difficult to fabricate using standard VLSI processes for a surface ejecting ink-jet<br>♦ Only relevant for electrostatic ink jets | ♦ Tone-jet |

ACTUATOR MOTION

| | Description | Advantages | Disadvantages | Examples |
|---|---|---|---|---|
| Volume expansion | The volume of the actuator changes, pushing the ink in all directions. | ♦ Simple construction in the case of thermal ink jet | ♦ High energy is typically required to achieve volume expansion. This leads to thermal stress, cavitation, and kogation in | ♦ Hewlett-Packard Thermal Ink jet<br>♦ Canon Bubblejet |

-continued

ACTUATOR MOTION

| | Description | Advantages | Disadvantages | Examples |
|---|---|---|---|---|
| Linear, normal to chip surface | The actuator moves in a direction normal to the print head surface. The nozzle is typically in the line of movement. | ◆ Efficient coupling to ink drops ejected normal to the surface | thermal ink jet implementations<br>◆ High fabrication complexity may be required to achieve perpendicular motion | ◆ IJ01, IJ02, IJ04, IJ07, IJ11, IJ14 |
| Parallel to chip surface | The actuator moves parallel to the print head surface. Drop ejection may still be normal to the surface. | ◆ Suitable for planar fabrication | ◆ Fabrication complexity<br>◆ Friction<br>◆ Stiction | ◆ IJ12, IJ13, IJ15, IJ33, IJ34, IJ35, IJ36 |
| Membrane push | An actuator with a high force but small area is used to push a stiff membrane that is in contact with the ink. | ◆ The effective area of the actuator becomes the membrane area | ◆ Fabrication complexity<br>◆ Actuator size<br>◆ Difficulty of integration in a VLSI process | ◆ 1982 Howkins U.S. Pat. No. 4,459,601 |
| Rotary | The actuator causes the rotation of some element, such a grill or impeller | ◆ Rotary levers may be used to increase travel<br>◆ Small chip area requirements | ◆ Device complexity<br>◆ May have friction at a pivot point | ◆ IJ05, IJ08, IJ13, IJ28 |
| Bend | The actuator bends when energized. This may be due to differential thermal expansion, piezoelectric expansion, magnetostriction, or other form of relative dimensional change. | ◆ A very small change in dimensions can be converted to a large motion. | ◆ Requires the actuator to be made from at least two distinct layers, or to have a thermal difference across the actuator | ◆ 1970 Kyser et al U.S. Pat. No. 3,946,398<br>◆ 1973 Stemme U.S. Pat. No. 3,747,120<br>◆ IJ03, IJ09, IJ10, IJ19, IJ23, IJ24, IJ25, IJ29, IJ30, IJ31, IJ33, IJ34, IJ35 |
| Swivel | The actuator swivels around a central pivot. This motion is suitable where there are opposite forces applied to opposite sides of the paddle, e.g. Lorenz force. | ◆ Allows operation where the net linear force on the paddle is zero<br>◆ Small chip area requirements | ◆ Inefficient coupling to the ink motion | ◆ IJ06 |
| Straighten | The actuator is normally bent, and straightens when energized. | ◆ Can be used with shape memory alloys where the austenic phase is planar | ◆ Requires careful balance of stresses to ensure that the quiescent bend is accurate | ◆ IJ26, IJ32 |
| Double bend | The actuator bends in one direction when one element is energized, and bends the other way when another element is energized. | ◆ One actuator can be used to power two nozzles.<br>◆ Reduced chip size.<br>◆ Not sensitive to ambient temperature | ◆ Difficult to make the drops ejected by both bend directions identical,<br>◆ A small efficiency loss compared to equivalent single bend actuators. | ◆ IJ36, IJ37, IJ38 |
| Shear | Energizing the actuator causes a shear motion in the actuator material. | ◆ Can increase the effective travel of piezoelectric actuators | ◆ Not readily applicable to other actuator mechanisms | ◆ 1985 Fishbeck U.S. Pat. No. 4,584,590 |
| Radial constriction | The actuator squeezes an ink reservoir, forcing ink from a constricted nozzle. | ◆ Relatively easy to fabricate single nozzles from glass tubing as macroscopic structures | ◆ High force required<br>◆ Inefficient<br>◆ Difficult to integrate with VLSI processes | ◆ 1970 Zoltan U.S. Pat. No. 3,683,212 |
| Coil/uncoil | A coiled actuator uncoils or coils more tightly. The motion of the free end of the actuator ejects the ink. | ◆ Easy to fabricate as a planar VLSI process.<br>◆ Small area required, therefore low cost | ◆ Difficult to fabricate for non-planar devices<br>◆ Poor out-of-plane stiffness | ◆ IJ17, IJ21, IJ34, IJ35 |
| Bow | The actuator bows (or buckles) in the middle when energized. | ◆ Can increase the speed of travel<br>◆ Mechanically | ◆ Maximum travel is constrained<br>◆ High force | ◆ IJ16, IJ18, IJ27 |

-continued

ACTUATOR MOTION

| | Description | Advantages | Disadvantages | Examples |
|---|---|---|---|---|
| Push-Pull | Two actuators control a shutter. One actuator pulls the shutter, and the other pushes it. | rigid<br>◆ The structure is pinned at both ends, so has a high out-of-plane rigidity | required<br>◆ Not readily suitable for ink jets which directly push the ink | ◆ IJ18 |
| Curl inwards | A set of actuators curl inwards to reduce the volume of ink that they enclose. | ◆ Good fluid flow to the region behind the actuator increases efficiency | ◆ Design complexity | ◆ IJ20, IJ42 |
| Curl outwards | A set of actuators curl outwards, pressurizing ink in a chamber surrounding the actuators, and expelling ink from a nozzle in the chamber. | ◆ Relatively simple construction | ◆ Relatively large chip area | ◆ IJ43 |
| Iris | Multiple vanes enclose a volume of ink. These simultaneously rotate, reducing the volume between the vanes. | ◆ High efficiency<br>◆ Small chip area | ◆ High fabrication complexity<br>◆ Not suitable for pigmented inks | ◆ IJ22 |
| Acoustic vibration | The actuator vibrates at a high frequency. | ◆ The actuator can be physically distant from the ink | ◆ Large area required for efficient operation at useful frequencies<br>◆ Acoustic coupling and crosstalk<br>◆ Complex drive circuitry<br>◆ Poor control of drop volume and position | ◆ 1993 Hadimioglu et al, EUP 550,192<br>◆ 1993 Elrod et al, EUP 572,220 |
| None | In various ink jet designs the actuator does not move. | ◆ No moving parts | ◆ Various other tradeoffs are required to eliminate moving parts | ◆ Silverbrook, EP 0771 658 A2 and related patent applications<br>◆ Tone-jet |

NOZZLE REFILL METHOD

| | Description | Advantages | Disadvantages | Examples |
|---|---|---|---|---|
| Surface tension | This is the normal way that ink jets are refilled. After the actuator is energized, it typically returns rapidly to its normal position. This rapid return sucks in air through the nozzle opening. The ink surface tension at the nozzle then exerts a small force restoring the meniscus to a minimum area. This force refills the nozzle. | ◆ Fabrication simplicity<br>◆ Operational simplicity | ◆ Low speed<br>◆ Surface tension force relatively small compared to actuator force<br>◆ Long refill time usually dominates the total repetition rate | ◆ Thermal ink jet<br>◆ Piezoelectric ink jet<br>◆ IJ01–IJ07, IJ10–IJ14, IJ16, IJ20, IJ22–IJ45 |
| Shuttered oscillating ink pressure | Ink to the nozzle chamber is provided at a pressure that oscillates at twice the drop ejection frequency. when a drop is to be ejected, the shutter is opened for 3 half cycles: drop ejection, actuator return, and refill. The | ◆ High speed<br>◆ Low actuator energy, as the actuator need only open or close the shutter, instead of ejecting the ink drop | ◆ Requires common ink pressure oscillator<br>◆ May not be suitable for pigmented inks | ◆ IJ08, IJ13, IJ15, IJ17, IJ18, IJ19, IJ21 |

-continued

NOZZLE REFILL METHOD

| | Description | Advantages | Disadvantages | Examples |
|---|---|---|---|---|
| | shutter is then closed to prevent the nozzle chamber emptying during the next negative pressure cycle. | | | |
| Refill actuator | After the main actuator has ejected a drop a second (refill) actuator is energized. The refill actuator pushes ink into the nozzle chamber. The refill actuator returns slowly, to prevent its return from emptying the chamber again. | ◆ High speed, as the nozzle is actively refilled | ◆ Requires two independent actuators per nozzle | ◆ IJ09 |
| Positive ink pressure | The ink is held a slight positive pressure. After the ink drop is ejected, the nozzle chamber fills quickly as surface tension and ink pressure both operate to refill the nozzle. | ◆ High refill rate, therefore a high drop repetition rate is possible | ◆ Surface spill must be prevented ◆ Highly hydrophobic print head surfaces are required | ◆ Silverbrook, EP 0771 658 A2 and related patent applications ◆ Alternative for:, IJ01–IJ07, IJ10–IJ14, IJ16, IJ20, IJ22–IJ45 |

METHOD OF RESTRICTING BACK-FLOW THROUGH INLET

| | Description | Advantages | Disadvantages | Examples |
|---|---|---|---|---|
| Long inlet channel | The ink inlet channel to the nozzle chamber is made long and relatively narrow, relying on viscous drag to reduce inlet back-flow. | ◆ Design simplicity ◆ Operational simplicity ◆ Reduces crosstalk | ◆ Restricts refill rate ◆ May result in a relatively large chip area ◆ Only partially effective | ◆ Thermal ink jet ◆ Piezoelectric ink jet ◆ IJ42, IJ43 |
| Positive ink pressure | The ink is under a positive pressure, so that in the quiescent state some of the ink drop already protrudes from the nozzle. This reduces the pressure in the nozzle chamber which is required to eject a certain volume of ink. The reduction in chamber pressure results in a reduction in ink pushed out through the inlet. | ◆ Drop selection and separation forces can be reduced ◆ Fast refill time | ◆ Requires a method (such as a nozzle rim or effective hydrophobizing, or both) to prevent flooding of the ejection surface of the print head. | ◆ Silverbrook, EP 0771 658 A2 and related patent applications ◆ Possible operation of the following: IJ01–IJ07, IJ09–IJ12, IJ14, IJ16, IJ20, IJ22, IJ23–IJ34, IJ36–IJ41, IJ44 |
| Baffle | One or more baffles are placed in the inlet ink flow. When the actuator is energized, the rapid ink movement creates eddies which restrict the flow through the inlet. The slower refill process is unrestricted, and does not result in eddies. | ◆ The refill rate is not as restricted as the long inlet method, ◆ Reduces crosstalk | ◆ Design complexity ◆ May increase fabrication complexity (e.g. Tektronix hot melt Piezoelectric print heads). | ◆ HP Thermal Ink Jet ◆ Tektronix piezoelectric ink jet |
| Flexible flap restricts inlet | In this method recently disclosed by Canon, the expanding actuator (bubble) pushes on a | ◆ Significantly reduces back-flow for edge-shooter thermal ink jet | ◆ Not applicable to most ink jet configurations ◆ Increased | ◆ Canon |

-continued

METHOD OF RESTRICTING BACK-FLOW THROUGH INLET

| | Description | Advantages | Disadvantages | Examples |
|---|---|---|---|---|
| | flexible flap that restricts the inlet. | devices | fabrication complexity<br>◆ Inelastic deformation of polymer flap results in creep over extended use | |
| Inlet filter | A filter is located between the ink inlet and the nozzle chamber. The filter has a multitude of small holes or slots, restricting ink flow. The filter also removes particles which may block the nozzle. | ◆ Additional advantage of ink filtration<br>◆ Ink filter may be fabricated with no additional process steps | ◆ Restricts refill rate<br>◆ May result in complex construction | ◆ IJ04, IJ12, IJ24, IJ27, IJ29, IJ30 |
| Small inlet compared to nozzle | The ink inlet channel to the nozzle chamber has a substantially smaller cross section than that of the nozzle, resulting in easier ink egress out of the nozzle than out of the inlet. | ◆ Design simplicity | ◆ Restricts refill rate<br>◆ May result in a relatively large chip area<br>◆ Only partially effective | ◆ IJ02, IJ37, IJ44 |
| Inlet shutter | A secondary actuator controls the position of a shutter, closing off the ink inlet when the main actuator is energized. | ◆ Increases speed of the ink-jet print head operation | ◆ Requires separate refill actuator and drive circuit | ◆ IJ09 |
| The inlet is located behind the ink-pushing surface | The method avoids the problem of inlet back-flow by arranging the ink-pushing surface of the actuator between the inlet and the nozzle. | ◆ Back-flow problem is eliminated | ◆ Requires careful design to minimize the negative pressure behind the paddle | ◆ IJ01, IJ03, IJ05, IJ06, IJ07, IJ10, IJ11, IJ14, IJ16, IJ22, IJ23, IJ25, IJ28, IJ31, IJ32, IJ33, IJ34, IJ35, IJ36, IJ39, IJ40, IJ41 |
| Part of the actuator moves to shut off the inlet | The actuator and a wall of the ink chamber are arranged so that the motion of the actuator closes off the inlet. | ◆ Significant reductions in back-flow can be achieved<br>◆ Compact designs possible | ◆ Small increase in fabrication complexity | ◆ IJ07, IJ20, IJ26, IJ38 |
| Nozzle actuator does not result in ink back-flow | In some configurations of ink jet, there is no expansion or movement of an actuator which may cause ink back-flow through the inlet. | ◆ Ink back-flow problem is eliminated | ◆ None related to ink back-flow on actuation | ◆ Silverbrook, EP 0771 658 A2 and related patent applications<br>◆ Valve-jet<br>◆ Tone-jet |

NOZZLE CLEARING METHOD

| | Description | Advantages | Disadvantages | Examples |
|---|---|---|---|---|
| Normal nozzle firing | All of the nozzles are fired periodically, before the ink has a chance to dry. When not in use the nozzles are sealed (capped) against air. The nozzle firing is usually performed during a special clearing cycle, after first moving the print | ◆ No added complexity on the print head | May not be sufficient to displace dried ink | ◆ Most inkjet systems IJ01, IJ02, IJ03, IJ04, IJ05, IJ06, IJ07, IJ09, IJ10, IJ11, IJ12, IJ14, IJ16, IJ20, IJ22, IJ23, IJ24, IJ25, IJ26, IJ27, IJ28, IJ29, IJ30, IJ31, IJ32, IJ33, IJ34, IJ36, IJ37, IJ38, |

-continued

NOZZLE CLEARING METHOD

| | Description | Advantages | Disadvantages | Examples |
|---|---|---|---|---|
| | head to a cleaning station. | | | IJ39, IJ40, IJ41, IJ42, IJ43, IJ44, IJ45 |
| Extra power to ink heater | In systems which heat the ink, but do not boil it under normal situations, nozzle clearing can be achieved by over-powering the heater and boiling ink at the nozzle. | ◆ Can be highly effective if the heater is adjacent to the nozzle | ◆ Requires higher drive voltage for clearing<br>◆ May require larger drive transistors | ◆ Silverbrook, EP 0771 658 A2 and related patent applications |
| Rapid success-ion of actuator pulses | The actuator is fired in rapid succession. In some configurations, this may cause heat build-up at the nozzle which boils the ink, clearing the nozzle. In other situations, it may cause sufficient vibrations to dislodge clogged nozzles. | ◆ Does not require extra drive circuits on the print head<br>◆ Can be readily controlled and initiated by digital logic | ◆ Effectiveness depends substantially upon the configuration of the inkjet nozzle | ◆ Maybe used with: IJ01, IJ02, IJ03, IJ04, IJ05, IJ06, IJ07, IJ09, IJ10, IJ11, IJ14, IJ16, IJ20, IJ22, IJ23, IJ24, IJ25, IJ27, IJ28, IJ29, IJ30, IJ31, IJ32, IJ33, IJ34, IJ36, IJ37, IJ38, IJ39, IJ40, IJ41, IJ42, IJ43, IJ44, IJ45 |
| Extra power to ink pushing actuator | where an actuator is not normally driven to the limit of its motion, nozzle clearing may be assisted by providing an enhanced drive signal to the actuator. | ◆ A simple solution where applicable | ◆ Not suitable where there is a hard limit to actuator movement | ◆ May be used with: IJ03, IJ09, IJ16, IJ20, IJ23, IJ24, IJ25, IJ27, IJ29, IJ30, IJ31, IJ32, IJ39, IJ40, IJ41, IJ42, IJ43, IJ44, IJ45 |
| Acoustic resonance | An ultrasonic wave is applied to the ink chamber. This wave is of an appropriate amplitude and frequency to cause sufficient force at the nozzle to clear blockages. This is easiest to achieve if the ultrasonic wave is at a resonant frequency of the ink cavity. | A high nozzle clearing capability can be achieved<br>◆ May be implemented at very low cost in systems which already include acoustic actuators | ◆ High implementation cost if system does not already include an acoustic actuator | ◆ IJ08, IJ13, IJ15, IJ17, IJ18; IJ19, IJ21 |
| Nozzle clearing plate | A microfabricated plate is pushed against the nozzles. The plate has a post for every nozzle. A post moves through each nozzle, displacing dried ink. | ◆ Can clear severely clogged nozzles | ◆ Accurate mechanical alignment is required<br>◆ Moving parts are required<br>◆ There is risk of damage to the nozzles<br>◆ Accurate fabrication is required | ◆ Silverbrook, EP 0771 658 A2 and related patent appiications |
| Ink pressure pulse | The pressure of the ink is temporarily increased so that ink streams from all of the nozzles. This may be used in conjunction with actuator energizing. | ◆ May be effective where other methods cannot be used | ◆ Requires pressure pump or other pressure actuator<br>◆ Expensive<br>◆ Wasteful of ink | ◆ May be used with all IJ series ink jets |
| Print head wiper | A flexible 'blade' is wiped across the print head surface. The blade is usually fabricated from a flexible polymer, e.g. rubber or synthetic elastomer. | ◆ Effective for planar print head surfaces<br>◆ Low cost | ◆ Difficult to use if print head surface is non-planar or very fragile<br>◆ Requires mechanical parts<br>◆ Blade can wear out in high volume | ◆ Many inkjet systems |

-continued

NOZZLE CLEARING METHOD

| | Description | Advantages | Disadvantages | Examples |
|---|---|---|---|---|
| Separate ink boiling heater | A separate heater is provided at the nozzle although the normal drop e-ection mechanism does not require it. The heaters do not require individual drive circuits, as many nozzles can be cleared simultaneously, and no imaging is required. | ◆ Can be effective where other nozzle clearing methods cannot be used<br>◆ Can be implemented at no additional cost in some inkjet configurations | print systems<br>◆ Fabrication complexity | ◆ Can be used with many IJ series ink jets |

NOZZLE PLATE CONSTRUCTION

| | Description | Advantages | Disadvantages | Examples |
|---|---|---|---|---|
| Electro-formed nickel | A nozzle plate is separately fabricated from electroformed nickel, and bonded to the print head chip. | ◆ Fabrication simplicity | ◆ High temperatures and pressures are required to bond nozzle plate<br>◆ Minimum thickness constraints<br>◆ Differential thermai expansion | ◆ Hewlett Packard Thermal Ink jet |
| Laser ablated or drilled polymer | Individual nozzle holes are ablated by an intense UV laser in a nozzle plate, which is typically a polymer such as polyimide or polysulphone | ◆ No masks required<br>◆ Can be quite fast<br>◆ Some control over nozzle profile is possible<br>◆ Equipment required is relatively low cost | ◆ Each hole must be individually formed<br>◆ Special equipment required<br>◆ Slow where there are many thousands of nozzles per print head<br>◆ May produce thin burrs at exit holes | ◆ Canon Bubblejet<br>◆ 1988 Sercel et al., SPIE, Vol 998 Excimer Beam Applications, pp. 76–83<br>◆ 1993 Watanabe et al., USP 5,208,604 |
| Silicon micro-machined | A separate nozzle plate is micromachined from single crystal silicon, and bonded to the print head wafer. | ◆ High accuracy is attainable | ◆ Two part construction<br>◆ High cost<br>◆ Requires precision alignment<br>◆ Nozzles may be clogged by adhesive | ◆ K. Bean, IEEE Transactions on Electron Devices, Voi. ED-25, No. 10, 1978, pp 1185–1195<br>◆ Xerox 1990 Hawkins et al., USP 4,899,181 |
| Glass capillaries | Fine glass capillaries are drawn from glass tubing. This method has been used for making individual nozzles, but is difficult to use for bulk manufacturing of print heads with thousands of nozzles. | ◆ No expensive equipment required<br>◆ Simple to make single nozzles | ◆ Very small nozzle sizes are difficult to form<br>◆ Not suited for mass production | ◆ 1970 Zoltan USP 3,683,212 |
| Monolithic, surface micro-machined using VLSI litho-graphic processes | The nozzle plate is deposited as a layer using standard VLSI deposition techniques. Nozzles are etched in the nozzle plate using VLSI lithography and etching. | ◆ High accuracy (<1 μm)<br>◆ Monolithic<br>◆ Low cost<br>◆ Existing processes can be used | ◆ Requires sacrificial layer under the nozzle plate to form the nozzle chamber<br>◆ Surface may be fragile to the touch | ◆ Silverbrook, EP 0771 658 A2 and related patent applications<br>◆ IJ01, IJ02, IJ04, IJ11, IJ12, IJ17, IJ18, IJ20, IJ22, IJ24, IJ27, IJ28, IJ29, IJ30, IJ31, IJ32, IJ33, IJ34, IJ36, JJ37, IJ38, IJ39, IJ40, IJ41, IJ42, IJ43, IJ44 |
| Monolithic, | The nozzle plate is a | ◆ High accuracy | ◆ Requires long | ◆ IJ03, IJ05, IJ06, |

NOZZLE PLATE CONSTRUCTION

| | Description | Advantages | Disadvantages | Examples |
|---|---|---|---|---|
| etched through substrate | buried etch stop in the wafer. Nozzle chambers are etched in the front of the wafer, and the wafer is thinned from the back side. Nozzles are then etched in tbe etch stop layer. | (<1 $\mu$m)<br>♦ Monolithic<br>♦ Low cost<br>♦ No differential expansion | ♦ etch times<br>♦ ♦ Requires a support wafer | IJ07, IJ08, IJ09, IJ10, IJ13, IJ14, IJ15, IJ16, IJ19, IJ21, IJ23, IJ25, IJ26 |
| No nozzle plate | ♦ Various methods have been tried to eliminate the nozzles entirely, to prevent nozzle clogging. These include thermal bubble mechanisms and acoustic lens mechanisms | ♦ No nozzles to become clogged | ♦ Difficult to control drop position accurately<br>♦ Crosstalk problems | ♦ Ricoh 1995 Sekiya et al USP 5,412,413<br>1993 Hadimioglu et al EUP 550,192<br>1993 Elrod et al EUP 572,220 |
| Trough | Each drop ejector has a trough through which a paddle moves. There is no nozzle plate. | ♦ Reduced manufacturing complexity<br>♦ Monolithic | ♦ Drop firing direction is sensitive to wicking | ♦ IJ35 |
| Nozzle slit instead of individual nozzles | The elimination of nozzle holes and replacement by a slit encompassing many actuator positions reduces nozzle clogging, but increases crosstalk due to ink surface waves | ♦ No nozzles to become clogged | ♦ Difficult to control drop position accurately<br>♦ Crosstalk problems | ♦ 1989 Saito et al USP 4,799,068 |

DROP EJECTION DIRECTION

| | Description | Advantages | Disadvantages | Examples |
|---|---|---|---|---|
| Edge ('edge shooter') | Ink flow is along the surface of the chip, and ink drops are ejected from the chip edge. | ♦ Simple construction<br>♦ No silicon etching required<br>♦ Good heat sinking via substrate<br>♦ Mechanically strong<br>♦ Ease of chip handing | ♦ Nozzles limited to edge<br>♦ High resolution is difficult<br>Fast color printing requires one print head per color | ♦ Canon Bubblejet 1979 Endo et al GB patent 2,007,162<br>♦ Xerox heater-in-pit 1990 Hawkins et al USP 4,899,181<br>♦ Tone-jet |
| Surface ('roof shooter') | Ink flow is along the surface of the chip, and ink drops are ejected from the chip surface, normal to the plane of the chip. | ♦ No bulk silicon etching required<br>♦ Silicon can make an effective heat sink<br>♦ Mechanical strength | Maximum ink flow is severely restricted | ♦ Hewlett-Packard TIJ 1982 Vaught et al USP 4,490,728 IJ02, IJ11, IJ12, IJ20, IJ22 |
| Through chip, forward ('up shooter') | Ink flow is through the chip, and ink drops are ejected from the front surface of the chip. | ♦ High ink flow<br>♦ Suitable for pagewidth print heads<br>♦ High nozzle packing density therefore low manufacturing cost | ♦ Requires buik silicon etching | ♦ Silverbrook, EP 0771 658 A2 and related patent applications<br>♦ IJ04, IJ17, IJ18, IJ24, IJ27–IJ45 |
| Through | Ink flow is through the | ♦ High ink flow | ♦ Requires wafer | ♦ IJ01, IJ03, IJ05, |

-continued

DROP EJECTION DIRECTION

| | Description | Advantages | Disadvantages | Examples |
|---|---|---|---|---|
| chip, reverse ('down shooter') | chip, and ink drops are ejected from the rear surface of the chip. | ◆ Suitable for pagewidth print heads<br>◆ High nozzle packing density therefore low manufacturing cost | thinning<br>◆ Requires special handling during manufacture | IJ06, IJ07, IJ08, IJ09, IJ10, IJ13, IJ14, IJ15, IJ16, IJ19, IJ21, IJ23, IJ25, IJ26 |
| Through actuator | Ink flow is through the actuator, which is not fabricated as part of the same substrate as the drive transistors. | ◆ Suitable for piezoelectric print heads | ◆ Pagewidth print heads require several thousand connections to drive circuits<br>Cannot be manufactured in standard CMOS fabs<br>◆ Complex assembly required | Epson Stylus<br>◆ Tektronix hot melt piezoelectric ink jets |

| INK TYPE | | | | |
|---|---|---|---|---|
| | Description | Advantages | Disadvantages | Examples |
| Aqueous, dye | Water based ink which typically contains: water, dye, surfactant, humectant, and biocide. Modern ink dyes have high water-fastness, light fastness | Environmentally friendly ◆ No odor | ◆ Slow drying ◆ Corrosive ◆ Bleeds on paper ◆ May strikethrough ◆ Cockles paper | ◆ Most existing ink jets ◆ All IJ series ink * jets ◆ Silverbrook, EP 0771 658 A2 and related patent applications |
| Aqueous, pigment | Water based ink which typically contains: water, pigment, surfactant, humectant, and biocide. Pigments have an advantage in reduced bleed, wicking and strikethrough. | Environmentally friendly ◆ No odor Reduced bleed ◆ Reduced wicking ◆ Reduced strikethrough | ◆ Slow drying ◆ Corrosive ◆ Pigment may clog nozzles ◆ Pigment may clog actuator mechanisms ◆ Cockles paper | ◆ IJ02, IJ04, IJ21, IJ26, IJ27, IJ30 ◆ Silverbrook, EP 0771 658 A2 and related patent applications ◆ Piezoelectric ink-jets Thermal inkjets (with significant restrictions) |
| Methyl Ethyl Ketone (MEK) | MEK is a highly volatile solvent used for industrial printing on difficult surfaces such as aluminum cans. | ◆ Very fast drying ◆ Prints on various substrates such as metals and plastics | ◆ Odorous ◆ Flammable | ◆ All IJ series ink jets |
| Alcohol (ethanol, 2-butanol, and others) | Alcohol based inks can be used where the printer must operate at temperatures below the freezing point of water. An example of this is in-camera consumer photographic printing. | ◆ Fast drying ◆ Operates at sub-freezing temperatures ◆ Reduced paper cockle ◆ Low cost | ◆ Slight odor ◆ Flammable | ◆ All IJ series ink jets |
| Phase change (hot melt) | The ink is solid at room temperature, and is melted in the print head before jetting. Hot melt inks are usually wax based, with a melting point around 80° C. After jetting the ink freezes almost instantly upon contacting the print medium or a transfer roller. | ◆ No drying time-ink instantly freezes on the print medium ◆ Almost any print medium can be used ◆ No paper cockle occurs ◆ No wicking occurs ◆ No bleed occurs ◆ No strikethrough occurs | ◆ High viscosity ◆ Printed ink typically has a 'waxy' feel ◆ Printed pages may 'block' ◆ Ink temperature may be above the curie point of permanent magnets ◆ Ink heaters consume power ◆ Long warm-up time | ◆ Tektronix hot melt piezoelectric inkjets ◆ 1989 Nowak USP 4,820,346 ◆ All IJ series ink jets |
| Oil | Oil based inks are extensively used in offset printing. They have advantages in improved characteristics on paper (especially no wicking or cockle). Oil soluble dies and pigments are required. | ◆ High solubility medium for some dyes ◆ Does not cockle paper ◆ Does not wick through paper | ◆ High viscosity: this is a significant limitation for use in ink jets, which usually require a low viscosity. Some short chain and multi-branched oils have a sufficiently low viscosity. ◆ Slow drying | ◆ All IJ series ink jets |
| Micro-emulsion | A microemulsion is a stable, self forming emulsion of oil, water, and surfactant. The characteristic drop size is less than 100 nm, and is determined by the preferred curvature of the surfactant. | ◆ Stops ink bleed ◆ High dye solubility ◆ Water, oil, and amphiphilic soluble dies can be used ◆ Can stabilize pigment suspensions | ◆ Viscosity higher than water Cost is slightly higher than water based ink ◆ High surfactant concentration required (around 5%) | ◆ A11 IJ series ink jets |

What is claimed is:

1. A method of manufacturing an ink jet printhead that includes a series of nozzle chambers, the method comprising the steps of:

(a) providing a semiconductor wafer having an electrical circuitry layer and a buried epitaxial layer formed thereon;

(b) etching a plurality of ink chamber cavities in the semiconductor wafer and stopping the etching at substantially the epitaxial layer;

(c) depositing a first layer having a high saturation flux density on the electrical circuitry layer and etching the first layer to define fixed magnetic plates;

(d) depositing an insulating layer on the first layer and the electrical circuitry layer, and etching a vias for a subsequent conductive layer;

(e) depositing a conductive layer on the insulating layer and etching the conductive layer to form conductive coils conductively interconnected to the first layer;

(f) depositing a sacrificial material layer in the region of the first magnetic plates and the coils, and etching the sacrificial material layer to define apertures for a deposition of a second layer;

(g) depositing a second layer having a high saturation flux density and etching the second layer to form moveable magnetic plates, respective lever arms extending from the second magnetic plates, respective pistons on ends of the lever arms, respective fulcrums intermediate the second magnetic plates and the pistons and torsional springs at each fulcrum;

(h) etching a back of the wafer to the epitaxial layer;

(i) etching an ink ejection nozzle through the epitaxial layer so that the nozzle communicates with respective nozzle chamber cavities; and (j) etching away any remaining sacrificial layers.

2. A method as claimed in claim 1 which further comprises etching cavities in the sacrificial layer to accommodate the torsional springs and forming a series of the torsional springs in the cavities to be connected with the lever arms for resiliently biasing the moveable magnetic plates into a spaced position with respect to the fixed magnetic plates.

3. A method as claimed in claim 1 which includes forming the conductive layer substantially of copper.

4. A method as claimed in claim 1 further including the step of depositing corrosion barriers over portions of the wafer to reduce corrosion effects.

5. A method as claimed in claim 1 which includes etching vias so as to allow for electrical interconnection between portions of the layers.

6. A method as claimed in claim 1 which includes depositing the second layer of substantially a cobalt nickel iron alloy.

7. A method as claimed in claim 1 a double sided, polished CMOS wafer.

8. A method as claimed in claim 1 which includes separating the wafer into printhead chips.

* * * * *